(12) United States Patent
Fujita et al.

(10) Patent No.: US 8,822,111 B2
(45) Date of Patent: Sep. 2, 2014

(54) COLORED PHOTOSENSITIVE COMPOSITION, COLOR FILTER AND PROCESS FOR PRODUCING SAME, AND LIQUID-CRYSTAL DISPLAY DEVICE

(71) Applicant: Fujifilm Corporation, Tokyo (JP)

(72) Inventors: Akinori Fujita, Shizuoka-ken (JP);
Kazumasa Morozumi, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/217,506

(22) Filed: Mar. 18, 2014

(65) Prior Publication Data

US 2014/0198285 A1    Jul. 17, 2014

Related U.S. Application Data

(63) Continuation of application No. PCT/JP2012/071894, filed on Aug. 29, 2012.

(30) Foreign Application Priority Data

Sep. 30, 2011 (JP) ................. 2011-217810

(51) Int. Cl.
*G02B 5/20* (2006.01)
*G02F 1/1335* (2006.01)
*G03F 7/031* (2006.01)

(52) U.S. Cl.
USPC .......................................... 430/7; 430/270.1

(58) Field of Classification Search
None
See application file for complete search history.

(56) References Cited

FOREIGN PATENT DOCUMENTS

| JP | 2001-108815 A | 4/2001 |
|---|---|---|
| JP | 3387541 B2 | 3/2003 |
| JP | 2006-071890 A | 3/2006 |
| JP | 2007-039478 A | 2/2007 |
| JP | 2008-074922 A | 4/2008 |
| JP | 2008-292970 A | 12/2008 |
| JP | 2009-169231 A | 7/2009 |
| JP | 2010-243811 A | * 10/2010 |

OTHER PUBLICATIONS

Computer-generated translation of JP 2010-243811 (Oct. 2010).*
Computer-generated translation of JP 2006-071890 (Mar. 2006).*

* cited by examiner

*Primary Examiner* — John A. McPherson
(74) *Attorney, Agent, or Firm* — SOLARIS Intellectual Property Group, PLLC

(57) ABSTRACT

A colored photosensitive composition includes: (A) a dye represented by the following Formula (1); (B) a multifunctional thiol compound; (C) a photopolymerization initiator represented by the following Formula (2); and (D) a polymerizable compound. In Formula (1), each of A and B independently represents an organic group containing an aromatic ring or an organic group containing a heterocyclic ring. In Formula (2), each of C, D, and E independently represents a hydrogen atom or an organic group.

Formula (1)

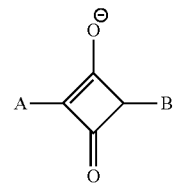

Formula (2)

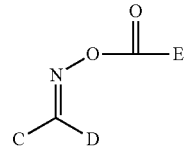

12 Claims, No Drawings

COLORED PHOTOSENSITIVE COMPOSITION, COLOR FILTER AND PROCESS FOR PRODUCING SAME, AND LIQUID-CRYSTAL DISPLAY DEVICE

CROSS-REFERENCE TO RELATED APPLICATIONS

This application is a continuation application of International Application No. PCT/JP/2012/071894, filed Aug. 29, 2012, the disclosure of which is incorporated herein by reference in its entirety. Further, this application claims priority from Japanese Patent Application No. 2011-217810, filed Sep. 30, 2011, the disclosure of which is incorporated herein by reference in its entirety.

TECHNICAL FIELD

The present invention relates to a colored photosensitive composition that includes a dye as a coloring agent, a color filter and a method of producing the same, and a liquid crystal display device.

BACKGROUND ART

A pigment dispersion method is widely used as one method of producing a color filter for use in liquid crystal display devices. Pigment dispersion methods include a method in which a color filter is produced through photolithography using colored photosensitive compositions in which pigments are dispersed in various photosensitive compositions. This method is stable against light and heat since the colored photosensitive compositions contain pigments as coloring agents. Moreover, since patterning is performed through photolithography in this method, a sufficiently high positional precision of the formed patterns is ensured. Therefore, this method is preferable for production of color filters and the like that are used in liquid crystal display devices and the like.

Coloring agents that are extensively studied for use in the production of color filters include pigments as well as coloring compounds other than pigments, such as dyes. Dyes, from among the coloring compounds, that are known include compounds having a wide variety of colorant mother structures, such as squarylium-based dyes, pyrromethene-based dyes, pyrimidine azo-based dyes, pyrazole azo-based dyes, and xanthene-based dyes (refer to, for example, Japanese Patent Application Laid-Open (JP-A) No. 2008-74922, JP-A No. 2008-292970, JP-A No. 2007-039478, and Japanese Patent No. 3387541). It is also disclosed that a color filter having excellent contrast and the like can be obtained when a specific anthraquinone compound is used as a dye (refer to, for example, JP-A No. 2001-108815).

The use of a dye as a coloring agent is considered to be useful, considering that the hue and brightness of the image displayed at the time of image display can be improved owing to the color purity of the dye per se and the vividness of the hue thereof.

Furthermore, a colored photosensitive composition that includes an organic solvent-soluble dye, an alkali-soluble binder, and a multifunctional thiol compound or the like has been devised, and it is known that a rectangular pattern can be obtained with high sensitivity using this colored photosensitive composition (refer to, for example, JP-A No. 2006-71890). It is also known that a colored photosensitive composition in which a coloring agent, such as a dye, and a low-molecular-weight binder having a specific structure including an unsaturated group are used has improved solvent resistance and the like (refer to, for example, JP-A No. 2009-169231).

SUMMARY OF INVENTION

In a case in which a color filter is formed using a colored photosensitive composition, it is requested that the adhesion of the color filter to a substrate be favorable and that the elution of metal ions be small. In a case in which a large amount of metal ions is eluted and in which sufficient adhesion is not achieved, production of a liquid crystal display device using the color filter, for example, may result in lack of sharpness due to low definition of the image pattern and/or defective image display due to occurrence of cross-talking or the like. From the viewpoints of the definition of the image pattern itself, prevention of the occurrence of cross-talking, and the like, a color filter having favorable electrical properties is desired.

As described above in the explanation of the background art, dyes are expected to be effective as coloring agents from the viewpoint of improving contrast, color reproduction, and the like. However, in order to use a dye in a color filter for a liquid crystal display device, a colored photosensitive composition with which a colored pattern having excellent adhesiveness to a substrate and excellent electrical properties can be obtained has been desired.

The present invention was made in view of these circumstances. Specific aspects of the invention include the following:

<1> A colored photosensitive composition including (A) a dye represented by the following Formula (1), (B) a multifunctional thiol compound, (C) a photopolymerization initiator represented by the following Formula (2), and (D) a polymerizable compound.

In the following Formula (1), each of A and B independently represents an organic group containing an aromatic ring or an organic group containing a heterocyclic ring. In the following Formula (2), each of C, D, and E independently represents a hydrogen atom or an organic group.

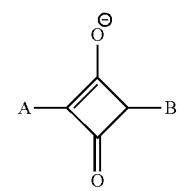

Formula (1)

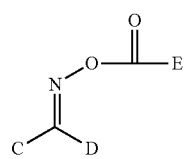

Formula (2)

<2> The colored photosensitive composition according to <1>, wherein the (C) photopolymerization initiator includes an oxime compound represented by the following Formula (3).

Formula (3)

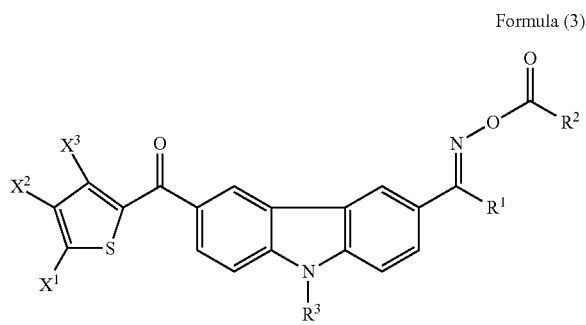

In Formula (3), each of $X^1$, $X^2$, and $X^3$ independently represents a hydrogen atom, a halogen atom, or an alkyl group, $R^1$ represents —R, —OR, —COR, —SR, —CONRR', or —CN, and each of $R^2$ and $R^3$ independently represents —R, —OR, —COR, —SR, or —NRR'. Each of R and R' independently represents an alkyl group, an aryl group, an aralkyl group, or a heterocyclic group.

<3> The colored photosensitive composition according to <1> or <2>, wherein the (C) photopolymerization initiator includes an oxime compound represented by the following Formula (4).

Formula (4)

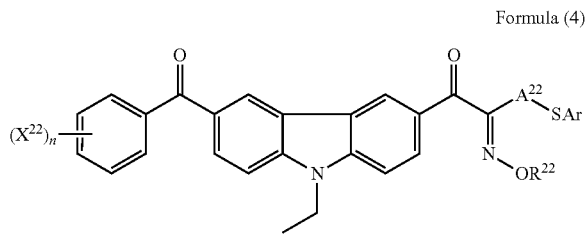

In Formula (4), $R^{22}$ represents a monovalent substituent. $A^{22}$ represents a divalent linking group, Ar represents an aryl group, n represents an integer from 0 to 5, and $X^{22}$ represents a monovalent substituent. In a case in which n is an integer from 2 to 5, plural $X^{22}$s are present, and the plural $X^{22}$s may be the same as each other or different from each other.

<4> The colored photosensitive composition according to any one of <1> to <3>, wherein the (B) multifunctional thiol compound is a compound that has two or more groups represented by the following Formula (5).

Formula (5)

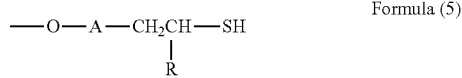

In Formula (5), R represents a hydrogen atom or an alkyl group, and A represents —CO— or —CH$_2$—.

<5> The colored photosensitive composition according to any one of <1> to <4>, wherein the (B) multifunctional thiol compound is a compound represented by the following Formula (6).

Formula (6)

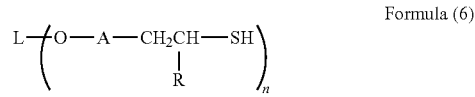

In Formula (6), R represents a hydrogen atom or an alkyl group, A represents —CO— or —CH$_2$—, L represents an n-valent linking group, and n represents an integer from 2 to 6.

<6> The colored photosensitive composition according to any one of <1> to <5>, wherein the content of the (B) multifunctional thiol compound is from 0.1% by mass to 20% by mass with respect to the total solid content of the colored photosensitive composition.

<7> The colored photosensitive composition according to any one of <1> to <6>, wherein the content of the (A) dye is from 0.1% by mass to 50% by mass with respect to the total solid content of the colored photosensitive composition.

<8> The colored photosensitive composition according to any one of <1> to <7>, further including an (E) yellow coloring agent.

<9> A color filter including a colored layer formed using the colored photosensitive composition according to any one of <1> to <8>.

<10> A method of producing a color filter including:
forming a colored layer by applying the colored photosensitive composition according to any one of <1> to <8> to a support (a colored layer formation process);
forming a latent image by patternwise exposing the colored layer to light (an exposure process); and
forming a pattern by developing the colored layer on which the latent image has been formed (a development process).

<11> A liquid crystal display device including the color filter according to <9> or a color filter produced by the method of producing a color filter according to <10>.

DESCRIPTION OF INVENTION

A colored photosensitive composition according to the invention is described below in detail. Further, a color filter according to the invention obtained using the colored photosensitive composition, a method of producing the color filter, and a liquid crystal display device are described below in detail.

Colored Photosensitive Composition

The colored photosensitive composition according to the invention includes at least (A) a dye represented by Formula (1) shown below, (B) a multifunctional thiol compound, (C) a photopolymerization initiator represented by Formula (2) shown below, and (D) a polymerizable compound. The colored photosensitive composition according to the invention may further include a binder such as an alkali-soluble resin, an organic solvent, and various types of additives, as necessary.

Besides pigments, dyes have also been studied as coloring components from the past. Dyes are expected to improve the hue, brightness, and contrast of images displayed at image display due to the color purity thereof and the vividness of the hue thereof. Similar to the case of using pigments, compositions in which dyes are used are requested to exhibit excellent adhesiveness to a substrate and to suppress the elution of metal ions; in other words, the compositions are requested to enable high-definition and vivid image display and to prevent the occurrence of cross-talking when used in liquid crystal display. However, some dyes are incapable of maintaining sufficient adhesion of the pattern to the substrate, or cause elution of a large amount of metal ions.

In view of these circumstances, in the invention, a colored photosensitive composition is formed using a squarylium-based dye having a specific structure together with a polymerizable compound as well as a multifunctional thiol compound and an oxime-based photopolymerization initiator. Due to this configuration, favorable curing sensitivity and image contrast can be obtained, formed patterns have excellent adhesiveness to substrates, and elution of metal ions is suppressed. As a result, in a case in which the colored photosensitive composition is used in pattern formation, an image having excellent hue and high contrast can be obtained; further, in the case of use in a liquid crystal display device, the specific resistance of the liquid crystal can favorably be maintained, and the image quality in the case of, for example, liquid crystal display is excellent.

Each of the components contained in the colored photosensitive composition according to the invention is described below in detail. As used herein, "from . . . to . . . " represents a range from the specified lower limit value to the specified upper limit value (inclusive). In addition, unless otherwise noted, the term "alkyl group" is a generic term that encompasses both of an alkyl group having a substituent and an alkyl group not having a substituent, and encompasses any of a linear alkyl group, a branched alkyl group, or a cyclic alkyl group.

Hereinafter, the colored photosensitive composition according to the invention is also referred to simply as the "colored composition according to the invention" or the "colored composition".

(A) Dye Represented by Formula (1)

The colored photosensitive composition according to the invention includes at least one dye represented by Formula (1) (also referred to below as a "specific squarylium compound" or a "specific squarylium dye"). The colored photosensitive composition according to the invention may include only one specific squarylium compound as a dye, or include two or more specific squarylium compounds as dyes.

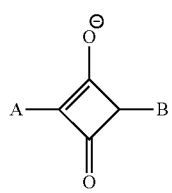

Formula (1)

In Formula (1), each of A and B independently represents an organic group containing an aromatic ring or an organic group containing a heterocyclic ring.

Examples of the organic group containing an aromatic ring or a heterocyclic ring and represented by A or B include groups represented by the following formulas (a) to (c).

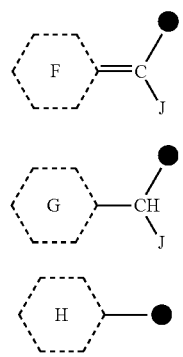

In Formulas (a) to (c), each of ring F, ring G, and ring H independently represents an aromatic ring or a heterocyclic ring. Here, "*" in each formula represents a bond species that binds to the cyclobutene ring of Formula (1).

Examples of the aromatic ring include a benzene ring and a naphthalene ring. The heterocyclic ring is preferably a 5-membered or 6-membered ring, and preferable examples thereof include a pyrrole ring, a thiazole ring, an indole ring, a thiapyran ring, a quinoline ring, a thiophene ring, a pyridine ring, and a pyrazole ring.

Each of ring F, ring G, and ring H may have a substituent. In a case in which any of ring F, ring G, and ring H has a substituent, adjacent substituents may be bonded to each other to further form a ring structure.

In addition, each J in the formulas (a) to (c) independently represents a hydrogen atom, an alkyl group that has 1 to 8 carbon atoms, or an aryl group having from 6 to 10 carbon atoms. Examples of the alkyl group having from 1 to 8 carbon atoms include a methyl group, an ethyl group, and a butyl group. Examples of the aryl group having from 6 to 10 carbon atoms include a phenyl group.

In particular, J preferably represents a hydrogen atom.

In the invention, any compound having a structure within the scope of Formula (1) can be used as a squarylium colorant, without particular limitation.

Examples of squarylium colorants having organic groups represented by A and B as substituents include compounds disclosed in JP-A No. 2006-241459, JP-A No. 2007-199421, JP-A No. 2008-145480, JP-A No. 2004-238606, JP-A No. 2011-144280, and *Top heterocycl chem.* 2008.14.133-181.

Specific examples A-1 to A-19 of the dye represented by Formula (1) are shown below. However, the invention is not limited thereto.

In the specific examples A-1 to A-19 shown below, "Me" represents a methyl group, and "Et" represents an ethyl group.

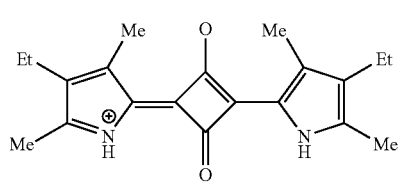

A-1

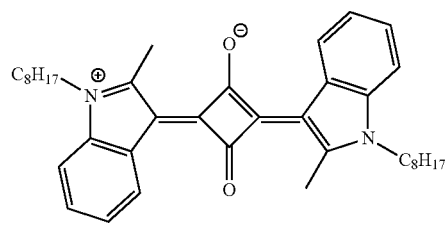

A-2

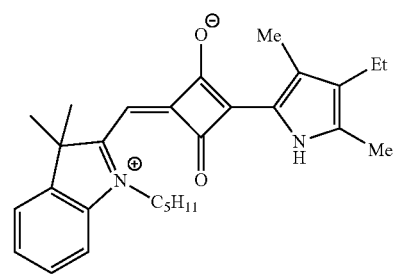

A-3

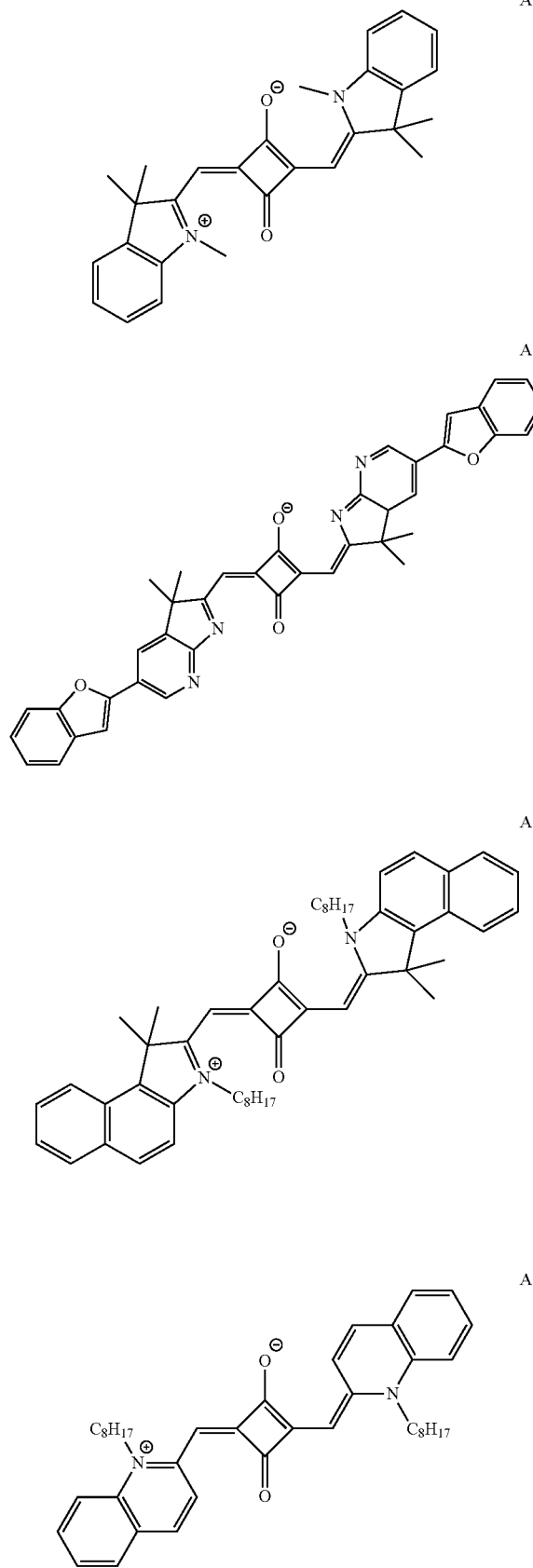
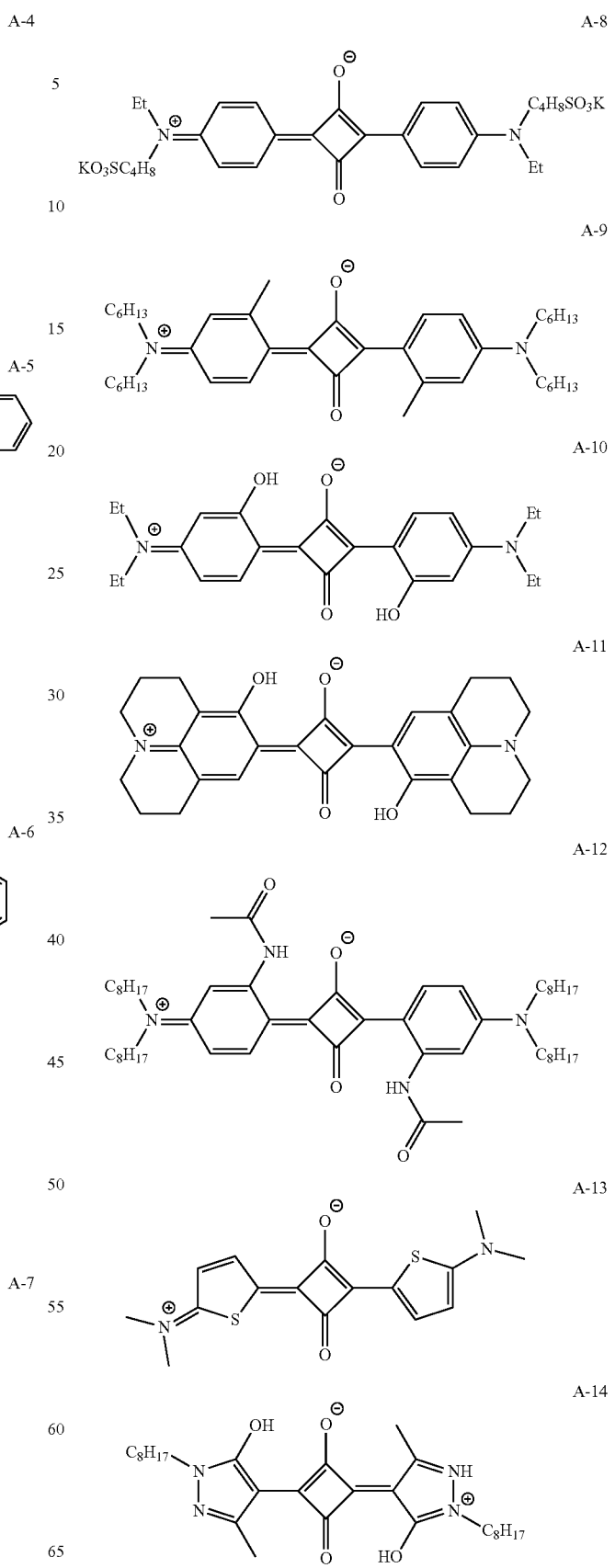

-continued

A-15
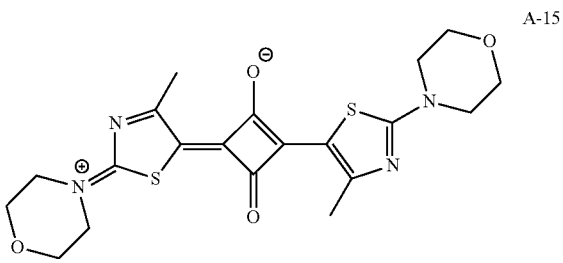

A-16
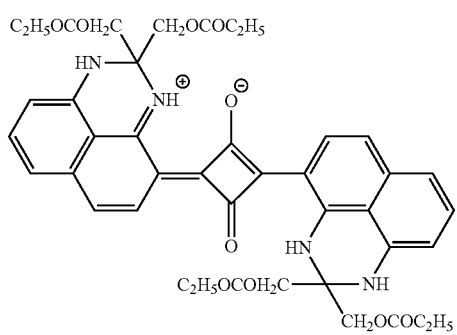

A-17
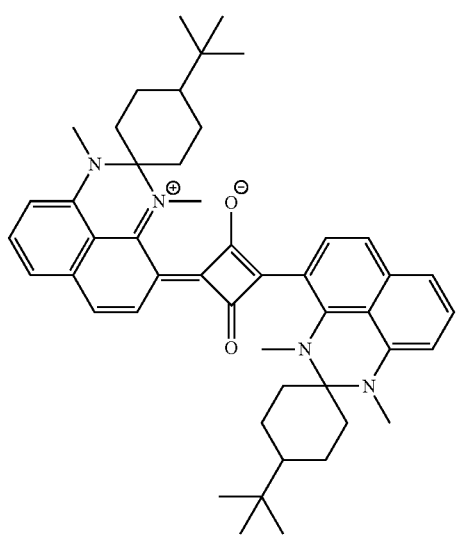

A-18
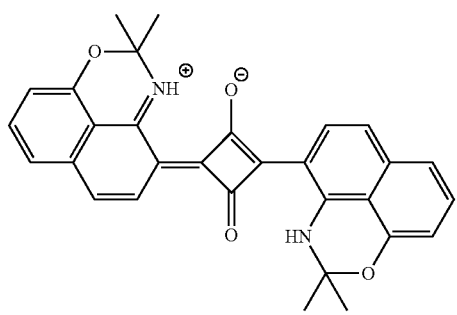

-continued

A-19
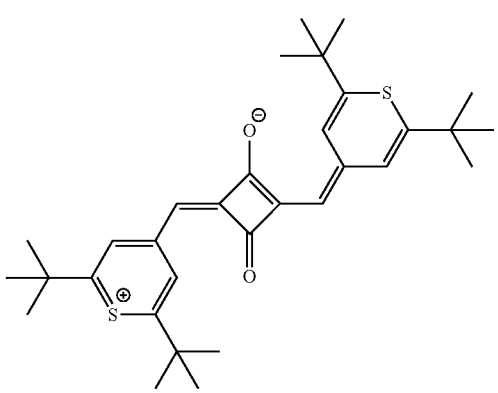

The content of dye represented by Formula (1) (specific squarylium compound) in the colored photosensitive composition (the total content in a case in which two or more dyes represented by Formula (1) are used) is preferably from 0.1% by mass to 50% by mass with respect to the total solid content of the colored photosensitive composition, and more preferably 0.5% to 30% by mass with respect to the total solid content of the colored photosensitive composition. By setting the content of dye represented by Formula (1) to be within this range, a favorable color density (for example, a color density suitable for liquid crystal display) is obtained. In particular, a content of 50% by mass or less with respect to the total solid content of the colored photosensitive composition is advantageous, considering that patterning (for example, patterning of the pixels in the case of forming a color filter) can favorably be performed when the content is 50% by mass or less.

Here, the total solid content of the colored photosensitive composition refers to the total amount of the other components of the colored photosensitive composition than solvent.

Other Coloring Agents

Other Dyes

The colored photosensitive composition according to the invention may include, together with the squarylium dye represented by Formula (1), known dyes other than the squarylium dye represented by Formula (1). A dye used together with the squarylium dye represented by Formula (1) is preferably a yellow dye.

Examples of dyes, other than the squarylium dye represented by Formula (1), that may be contained in the colored photosensitive composition according to the invention include methine-based dyes, pyridone azo-based dyes, acetoacetanilide azo-based dyes, pyrazolone azo-based dyes, pyrazole azo-based dyes, anilino azo-based dyes, triphenylmethane-based dyes, anthraquinone-based dyes, anthrapyridone-based dyes, benzylidene-based dyes, oxonol-based dyes, pyrazolotriazole azo-based dyes, cyanine-based dyes, phenothiazine-based dyes, pyrrolo pyrazole azomethine-based dyes, xanthene-based dyes, phthalocyanine-based dyes, penzopiran-based dyes, and indigo-based dyes.

In particular, methine-based dyes, pyridone azo-based dyes, acetoacetanilide azo-based dyes, and pyrazolone azo-based dyes, which are yellow dyes, are preferable.

Specific examples of dyes, other than the squarylium dye represented by Formula (1), that may be contained in the colored photosensitive composition according to the invention include dyes disclosed in JP-A No. S64-90403, JP-A No. S64-91102, JP-A No. H01-94301, JP-A No. H06-11614, Japanese Patent No. 2592207, U.S. Pat. No. 4,808,501, U.S. Pat. No. 5,667,920, U.S. Pat. No. 5,059,500, JP-A No. H05-

333207, JP-A No. H06-35183, JP-A No. H06-51115, JP-A No. H06-194828, JP-A No. H08-211599, JP-A No. H04-249549, JP-A No. H10-123316, JP-A No. H11-302283, JP-A No. H07-286107, JP-A No. 2001-4823, JP-A No. H08-15522, JP-A No. H08-29771, JP-A No. H08-146215, JP-A No. H11-343437, JP-A No. H08-62416, JP-A No. 2002-14220, JP-A No. 2002-14221, JP-A No. 2002-14222, JP-A No. 2002-14223, JP-A No. H08-302224, JP-A No. H08-73758, JP-A No. H08-179120, JP-A No. H08-151531, and JP-A No. H06-230210.

In a case in which at least one dye other than the squarylium dye represented by Formula (1) is used, the content of the at least one dye other than the squarylium dye represented by Formula (1) is preferably in a range of from 1% by mass to 200% by mass with respect to the squarylium dye represented by Formula (1), and more preferably from 10% by mass to 150% by mass with respect to the squarylium dye represented by Formula (1), from the viewpoint of avoiding impairment of the effect of the invention.

Pigment

The colored photosensitive composition according to the invention may include a pigment together with the squarylium dye represented by Formula (1). The pigment used together with the squarylium dye represented by Formula (1) is preferably a yellow pigment.

The pigment is preferably a pigment having an average primary particle diameter of from 10 nm to 30 nm. When the average primary particle diameter of the pigment is within this range, a colored photosensitive composition having more improved hue and contrast can be obtained.

Various inorganic pigments or organic pigments known thus far may be used as pigments. Organic pigments are preferable from the viewpoint of reliability. Examples of organic pigments include the organic pigments disclosed in paragraph [0093] of JP-A No. 2009-256572. In particular, C. I. Pigment Red 177, 224, 242, 254, 255, and 264, C. I. Pigment Yellow 138, 139, 150, 180, and 185, C. I. Pigment Orange 36, 38, and 71, C. I. Pigment Green 7, 36, and 58, C. I. Pigment Blue 15:6, and C. I. Pigment Violet 23 are preferable from the viewpoint of color reproducibility. However, the invention is not limited thereto.

These organic pigments may be used singly. Alternatively, the organic pigments may be used in combination of two or more thereof, with a view to increasing the color purity.

Among these, C. I. Pigment Yellow 138, 139, 150, 180, and 185, which are yellow pigments, are preferable.

In a case in which at least one pigment is contained in the colored photosensitive composition, the content of pigment in the colored photosensitive composition is preferably from 0.5% by mass to 50% by mass with respect to the total solid content of the composition, and more preferably from 1% by mass to 30% by mass with respect to the total solid content of the composition. A content of pigment within this range is effective in terms of ensuring excellent color properties.

(B) Multifunctional Thiol Compound

The colored photosensitive composition according to the invention includes at least one multifunctional thiol compound.

Since the colored photosensitive composition according to the invention includes a multifunctional thiol compound together with the squarylium compound described above and a photopolymerization initiator represented by the after-mentioned Formula (2), the colored photosensitive composition according to the invention has high sensitivity and high contrast, and, for example, elution of ions caused by colorants such as dyes is suppressed. In the invention, in the case of producing a color filter for use in liquid crystal display devices or the like, an image pattern having high definition can be obtained, and deterioration of image quality due to cross-talking can be prevented due to the specific resistance of the liquid crystal being favorably maintained, as a result of which a sharp, high-quality display is enabled.

Moreover, in a case in which a color filter is produced using the colored photosensitive composition according to the invention, since an appropriate taper can be provided to the pattern shape, disconnection of transparent electrodes hardly occurs when transparent electrodes are applied, protrusions or the like in the colored pattern (for example, pixels) are hardly formed in the development, and the pattern has excellent linearity. When a liquid crystal display device includes a color filter formed using the colored photosensitive composition according to the invention, the liquid crystal display device can display a high-quality image.

The multifunctional thiol compound means a compound having two or more thiol groups in a molecule thereof.

The multifunctional thiol compound is preferably a low-molecular-weight compound having a molecular weight of 100 or more; specifically, the molecular weight of the multifunctional thiol compound is preferably within a range of from 100 to 1500, and more preferably within a range of from 150 to 1000. In addition, the multifunctional thiol compound preferably has from 2 to 10 thiol groups in a molecule thereof, and more preferably has from 2 to 6 thiol groups in a molecule thereof.

The multifunctional thiol compound is preferably configured as a system that is used supplementary to the polymerization of the after-mentioned (D) polymerizable compound. Specifically, the content of multifunctional thiol compound is preferably set to be within a range of from 1% by mass to 20% by mass (preferably from 1% by mass to 5% by mass) with respect to the total solid content of the composition, or set to an amount that is less than the content of the after-mentioned (D) polymerizable compound.

The multifunctional thiol compound is preferably a compound having two or more groups represented by the following Formula (5).

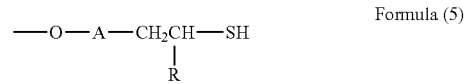

In Formula (5), R represents a hydrogen atom or an alkyl group, and A represents —CO— or —CH$_2$—.

The number of groups represented by Formula (5) in one molecule of the multifunctional thiol compound is preferably from 2 to 6, and more preferably from 2 to 4.

The alkyl group represented by R in Formula (5) may be any of a linear alkyl group, a branched alkyl group, or a cyclic alkyl group, and the alkyl group represented by R in Formula (5) is preferably an alkyl group having from 1 to 16 carbon atoms, more preferably an alkyl group having from 1 to 10 carbon atoms, and even more preferably an alkyl group having from 1 to 5 carbon atoms. Specific examples of the alkyl group include a methyl group, an ethyl group, a propyl group, an i-propyl group, a butyl group, a sec-butyl group, a tert-butyl group, a pentyl group, a hexyl group, and a 2-ethylhexyl group, and a methyl group, an ethyl group, a propyl group, and an i-propyl group are preferable.

In particular, a hydrogen atom, a methyl group, an ethyl group, a propyl group, and an i-propyl group are preferable as the alkyl group represented by R, and a methyl group and an ethyl group are most preferable.

The multifunctional thiol compound is particularly preferably a compound represented by the following Formula (6), which has two or more groups represented by Formula (5).

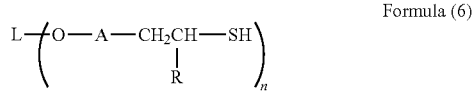

Formula (6)

In Formula (6), R represents a hydrogen atom or an alkyl group, and A represents —CO— or —CH$_2$—. L represents an n-valent linking group, and n represents an integer from 2 to 6.

The alkyl group represented by R in Formula (6) has the same definition as that of R in Formula (5), and preferable embodiments thereof are also the same as those of R in Formula (5).

In Formula (6), n is preferably an integer from 2 to 4.

Examples of L, which is an n-valent linking group in Formula (6), include a divalent linking group represented by —(CH$_2$)$_m$— (in which m=2 to 6), a trivalent trimethylol propane residue, a trivalent linking group obtained by attaching three —(CH$_2$)$_p$— (in which p=2 to 6) to an isocyanuric ring, a tetravalent pentaerythritol residue, and a hexavalent di-pentaerythritol residue.

Specific examples of preferable multifunctional thiol compounds include trimethylolpropane tris(3-mercaptopropionate), pentaerythritol tetrakis(3-mercaptopropionate), tetraethylene glycol bis(3-mercaptopropionate), dipentaerythritol hexakis(3-mercapto propionate), pentaerythritol tetrakis (thioglycolate), pentaerythritol tetrakis(3-mercapto butyrate), butanediol bis(3-mercapto butyrate), 1,4-bis(3-mercaptobutyloxy) butane, and 1,3,5-tris(3-mercaptobutyloxyethyl)-1,3,5-triazine-2,4,6(1H,3H,5H)-trione.

The content of multifunctional thiol compounds in the colored photosensitive composition is preferably from 0.01% by mass to 20% by mass with respect to the total solid content of the colored photosensitive composition, and more preferably from 0.1% by mass to 10% by mass with respect to the total solid content of the colored photosensitive composition. When the content of multifunctional thiol compound is within this range, the sensitivity and storage stability of the colored photosensitive composition are excellent, and, in the case of forming a pattern (for example, a color filter), the pattern (for example, pixels) has excellent adhesiveness to a substrate, and pattern defects can be suppressed to a low level. In addition, in the case of forming a color filter and using the color filter in a liquid crystal display device, the amount of metal ions eluted is suppressed to a low level, and excellent electrical properties are obtained.

(C) Photopolymerization Initiator

The colored photosensitive composition according to the invention includes at least one photopolymerization initiator represented by the following Formula (2). The photopolymerization initiator represented by Formula (2) is an oxime ester-based photopolymerization initiator, which has at least an oxime moiety in a molecule thereof, and the photopolymerization represented by Formula (2) is a compound that contributes to initiation/promotion of a polymerization reaction of the after-mentioned polymerizable compound through generation of an active species such as a radical when irradiated with light.

By using the oxime-based photopolymerization initiator represented by Formula (2) in a curing system in which the squarylium compound described above and the multifunctional thiol compound described above are used, the curing sensitivity is remarkably improved, and the formed pattern (for example, pixels in the case of production of a color filter) exhibits excellent adhesion to a substrate.

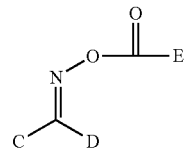

Formula (2)

In Formula (2), each of C, D, and E independently represents a hydrogen atom or an organic group. Examples of the organic group represented by any of C to E include an alkyl group, an aromatic ring group, and a heteroaromatic ring group.

The oxime-based photopolymerization initiator represented by Formula (2) is not particularly limited as long as the oxime-based photopolymerization initiator is able to polymerize the after-mentioned polymerizable compound, and the oxime-based photopolymerization initiator is preferably selected from the viewpoints of, for example, properties, initiation efficiency, absorption wavelength, availability, and cost. In particular, the oxime-based photopolymerization initiator is preferably a compound that is sensitive to actinic rays having a wavelength of 300 nm or longer, and that initiates/ promotes the polymerization of the polymerizable compound. Photopolymerization initiators that are not directly sensitive to actinic rays having a wavelength of 300 nm or longer can also be preferably used by being combined with a sensitizer.

Examples of the oxime ester compound include compounds disclosed in JP-A No. 2000-80068, JP-A No. 2001-233842, Japanese Patent Application National Publication (JP-A) No. 2004-534797, WO2005/080337, WO2006/018973, JP-A No. 2007-210991, JP-A No. 2007-231000, JP-A No. 2007-269779, JP-A No. 2009-191061, and WO2009/131189. Specific examples of the oxime ester compound include 2-(O-benzoyloxime)-1-[4-(phenylthio)phenyl]-1,2-butanedione, 2-(O-benzoyloxime)-1-[4-(phenylthio)phenyl]-1,2-pentanedione, 2-(O-benzoyloxime)-1-[4-(phenylthio)phenyl]-1,2-hexanedione, 2-(O-benzoyloxime)-1-[4-(phenylthio)phenyl]-1,2-heptanedione, 2-(O-benzoyloxime)-1-[4-(phenylthio)phenyl]-1,2-octane dione, 2-(O-benzoyloxime)-1-[4-(methylphenylthio)phenyl]-1,2-butanedione, 2-(O-benzoyloxime)-1-[4-(ethylphenylthio)phenyl]-1,2-butanedione, 2-(O-benzoyloxime)-1-[4-(butylphenylthio)phenyl]-1,2-butanedione, 1-(O-acetyloxime)-1-[9-ethyl-6-(2-methylbenzoyl)-9H-carbazol-3-yl]ethanone, 1-(O-acetyloxime)-1-[9-methyl-6-(2-methylbenzoyl)-9H-carbazol-3-yl]ethanone, 1-(O-acetyloxime)-1-[9-propyl-6-(2-methylbenzoyl)-9H-carbazol-3-yl]ethanone, 1-(O-acetyloxime)-1-[9-ethyl-6-(2-ethylbenzoyl)-9H-carbazol-3-yl]ethanone, and 1-(O-acetyloxime)-1-[9-ethyl-6-(2-butylbenzoyl)-9H-carbazole-3-yl]ethanone. However, the invention is not limited thereto.

In the invention, compounds represented by the following Formula (3) are preferable as oxime ester compounds, from the viewpoints of sensitivity, stability over time, and coloring at the time of post-heating.

Formula (3)

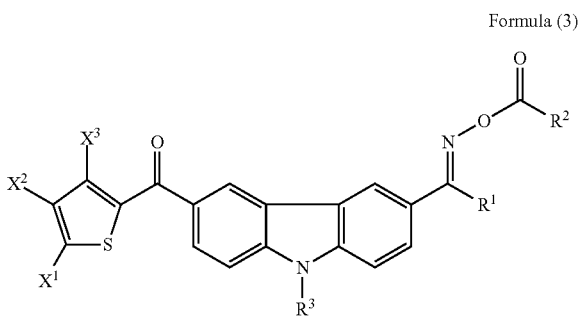

In Formula (3), each of $X^1$, $X^2$, and $X^3$ independently represents a hydrogen atom, a halogen atom, or an alkyl group; $R^1$ represents —R, —OR, —COR, —SR, —CONRR', or —CN; and each of $R^2$ and $R^3$ independently represents —R, —OR, —COR, —SR, or —NRR'. Each of R and R' independently represents an alkyl group, an aryl group, an aralkyl group, or a heterocyclic group, and these groups may be substituted by one or more selected from the group consisting of halogen atoms and heterocyclic groups. One or more of the carbon atoms in the alkyl chain in the alkyl group or aralkyl group represented by R or R' may be replaced with an unsaturated bond, an ether bond, or an ester bond. R and R' may be bonded to each other to form a ring.

In Formula (3), examples of the halogen atom represented by $X^1$, $X^2$, or $X^3$ include a fluorine atom, a chlorine atom, a bromine atom, and an iodine atom.

The alkyl group represented by $X^1$, $X^2$, or $X^3$ is preferably an alkyl group having from 1 to 12 carbon atoms, more preferably an alkyl group having from 1 to 8 carbon atoms. Specific examples of the alkyl group include a methyl group, an ethyl group, a propyl group, an isopropyl group, a butyl group, an isobutyl group, a secondary butyl group, a tertiary butyl group, an amyl group, an isoamyl group, a tertiary amyl group, a hexyl group, a heptyl group, an octyl group, an isooctyl group, a 2-ethylhexyl group, a tertiary octyl group, a nonyl group, an isononyl group, a decyl group, an isodecyl group, a vinyl group, an allyl group, a butenyl group, an ethynyl group, a propynyl group, a methoxyethyl group, an ethoxyethyl group, a propyloxyethyl group, a methoxyethoxyethyl group, an ethoxyethoxyethyl group, a propyloxyethoxyethyl group, a methoxy propyl group, a monofluoromethyl group, a difluoromethyl group, a trifluoromethyl group, a trifluoroethyl group, a perfluoroethyl group, and a 2-(benzoxazol-2'-yl)ethynyl group.

Among these, an embodiment in which each of $X^1$, $X^2$, and $X^3$ represents a hydrogen atom, and an embodiment in which $X^1$ represents an alkyl group (preferably an alkyl group having from 1 to 8 carbon atoms) and in which each of $X^2$ and $X^3$ represents a hydrogen atom, are preferable.

In Formula (3), the alkyl group represented by R or R' may be unsubstituted or have a substituent, and the alkyl group is preferably an alkyl group having from 1 to 12 carbon atoms, and more preferably an alkyl group having from 1 to 8 carbon atoms. Specific examples of the alkyl group include a methyl group, an ethyl group, a propyl group, an isopropyl group, a butyl group, an isobutyl group, a secondary butyl group, a tertiary butyl group, an amyl group, an isoamyl group, a tertiary amyl group, a hexyl group, a heptyl group, an octyl group, an isooctyl group, a 2-ethylhexyl group, a tertiary octyl group, a nonyl group, an isononyl group, a decyl group, an isodecyl group, a vinyl group, an allyl group, a butenyl group, an ethynyl group, a propynyl group, a methoxyethyl group, an ethoxyethyl group, a propyloxyethyl group, a methoxyethoxyethyl group, an ethoxyethoxyethyl group, a propyloxyethoxyethyl group, a methoxypropyl group, a monofluoromethyl group, a difluoromethyl group, a trifluoromethyl group, a trifluoroethyl group, a perfluoroethyl group, and a 2-(benzoxazol-2'-yl)ethynyl group.

The aryl group represented by R or R' may be unsubstituted or have a substituent. The aryl group is preferably an aryl group having from 6 to 20 carbon atoms, and more preferably an aryl group having from 6 to 12 carbon atoms. Specific examples of the aryl group include a phenyl group, a tolyl group, a xylyl group, an ethylphenyl group, a chlorophenyl group, a naphthyl group, an anthryl group, and a phenanthrenyl group.

The aralkyl group represented by R or R' may be unsubstituted or have a substituent. The aralkyl group is preferably an aralkyl group having from 7 to 20 carbon atoms, and more preferably an aralkyl group having from 7 to 12 carbon atoms. Specific examples of the aralkyl group include a benzyl group, a chlorobenzyl group, an α-methylbenzyl group, an α,α-dimethylbenzyl group, a phenylethyl group, and a phenylethenyl group.

The heterocyclic group represented by R or R' may be unsubstituted or have a substituent. The heterocyclic group is preferably a heterocyclic group having from 1 to 8 carbon atoms, and is more preferably a heterocyclic group having from 2 to 6 carbon atoms. Specific examples of the heterocyclic group include a pyridyl group, a pyrimidyl group, a furyl group, and a thiophenyl group.

Examples of the ring formed by bonding between R and R' include a piperidine ring and a morpholine ring.

$R^1$, when configured to include R or R', more preferably represents an alkyl group having from 1 to 8 carbon atoms, and particularly preferably represents an alkyl group having from 1 to 3 carbon atoms.

It is particularly preferable that each of $R^2$ and $R^3$, which are configured to include R and/or R', independently represents a methyl group, a hexyl group, a cyclohexyl group, —S-Ph, —S-Ph-Cl, or —S-Ph-Br, wherein Ph represents a phenyl group.

Among the photopolymerization initiators represented by Formula (3), photopolymerization initiators in which each of $X^1$, $X^2$, and $X^3$ represents a hydrogen atom, and in which $R^1$ represents an alkyl group (having preferably from 1 to 3 carbon atoms), particularly a methyl group, and in which $R^2$ represents an alkyl group (having preferably from 1 to 3 carbon atoms), particularly a methyl group, and in which $R^3$ represents an alkyl group (having preferably from 1 to 3 carbon atoms), particularly an ethyl group, are particularly preferable as photopolymerization initiators.

Accordingly, specific examples of preferable photopolymerization initiators represented by Formula (3) include compounds A to D illustrated below. However, the invention is not limited by the following compounds.

Compound A

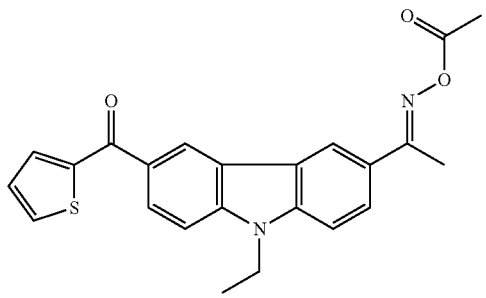

-continued

Compound B

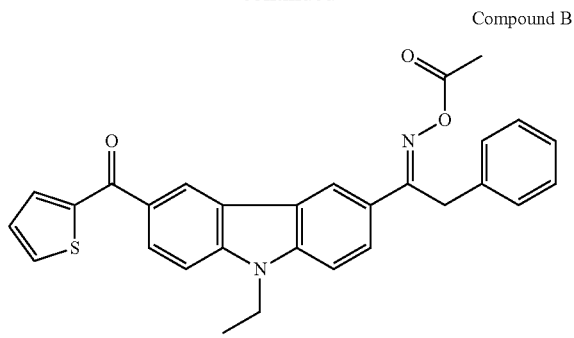

Compound C

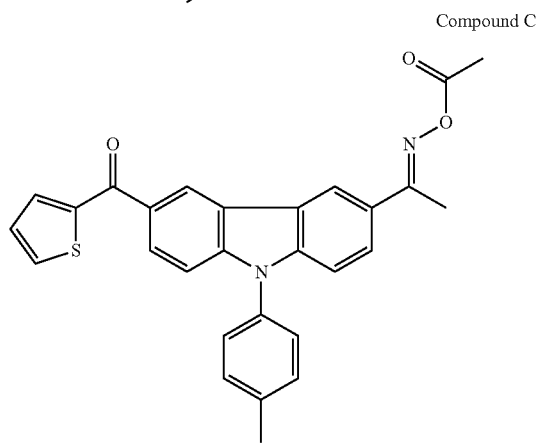

Compound D

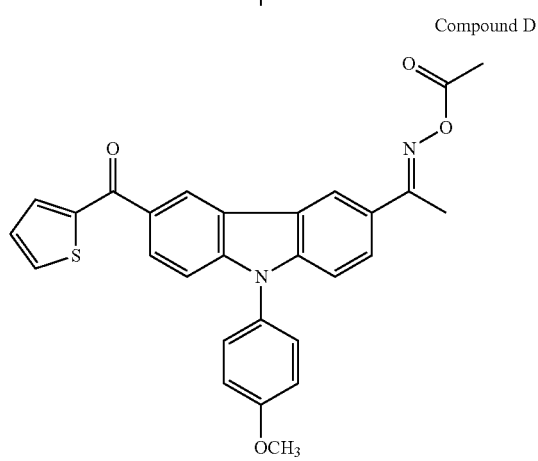

The photopolymerization initiator represented by Formula (3) can be synthesized according to a method disclosed in JP-A No. 2005-220097.

The compound represented by Formula (3) used in the invention has an absorption wavelength in the wavelength range of from 250 nm to 500 nm. More preferable examples of the compound include those having an absorption wavelength in the wavelength range of from 300 nm to 380 nm. In particular, those having high absorbance at 308 nm and 355 nm are preferable.

Furthermore, compounds represented by the following Formula (4) are also preferable as oxime ester compounds, from the viewpoints of sensitivity, stability over time, and coloring at the time of post-heating.

Formula (4)

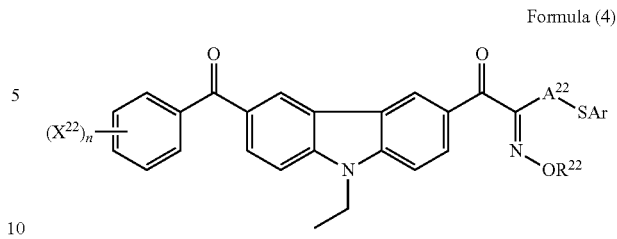

In Formula (4), $R^{22}$ represents a monovalent substituent; $A^{22}$ represents a divalent linking group; Ar represents an aryl group; n represents an integer from 0 to 5; and $X^{22}$ represents a monovalent substituent. In a case in which n represents an integer from 2 to 5, plural $X^{22}$s are present, and the plural $X^{22}$s may be the same as each other or different from each other.

The monovalent substituent represented by the $R^{22}$ is preferably a monovalent non-metal atomic group as described below.

Specifically, examples of the monovalent non-metal atomic group represented by $R^{22}$ include an alkyl group that may have a substituent, an aryl group that may have a substituent, an alkylsulfonyl group that may have a substituent, an arylsulfonyl group that may have a substituent, an acyl group that may have a substituent, and a heterocyclic group that may have a substituent.

The alkyl group that may have a substituent is preferably an alkyl group having from 1 to 30 carbon atoms, examples of which include a methyl group, an ethyl group, a propyl group, a butyl group, a hexyl group, a cyclopentyl group, a cyclohexyl group, and a trifluoromethyl group.

The aryl group that may have a substituent is preferably an aryl group having from 6 to 30 carbon atoms, examples of which include a phenyl group, a biphenyl group, a 1-naphthyl group, and a 2-naphthyl group.

The alkylsulfonyl group that may have a substituent is preferably an alkylsulfonyl group having from 1 to 20 carbon atoms, examples of which include a methylsulfonyl group and an ethylsulfonyl group.

The arylsulfonyl group that may have a substituent is preferably an arylsulfonyl group having from 6 to 30 carbon atoms, examples of which include a phenylsulfonyl group and a 1-naphthylsulfonyl group.

The acyl group that may have a substituent is preferably an acyl group having from 2 to 20 carbon atoms, examples of which include an acetyl group, a propanoyl group, a butanoyl group, a trifluoromethylcarbonyl group, a pentanoyl group, a benzoyl group, a 1-naphthoyl group, a 2-naphthoyl group, a 4-methylsulfanylbenzoyl group, a 4-phenylsulfanylbenzoyl group, a 4-dimethylaminobenzoyl group, a 4-diethylaminobenzoyl group, a 2-chlorobenzoyl group, a 2-methylbenzoyl group, a 2-methoxybenzoyl group, a 2-butoxybenzoyl group, a 3-chlorobenzoyl group, a 3-trifluoromethylbenzoyl group, a 3-cyanobenzoyl group, a 3-nitrobenzoyl group, a 4-fluorobenzoyl group, a 4-cyanobenzoyl group, and a 4-methoxybenzoyl group.

The heterocyclic group that may have a substituent is preferably an aromatic or aliphatic heterocyclic ring that includes at least one of a nitrogen atom, an oxygen atom, a sulfur atom, or a phosphorus atom. Examples thereof include a thienyl group, a furyl group, and a pyranyl group.

As $R^{22}$, from the viewpoint of high sensitivity, an acyl group that is unsubstituted or has a substituent is more preferable; specifically, an acetyl group that is unsubstituted or has a substituent, a propionyl group that is unsubstituted or has a substituent, a benzoyl group that is unsubstituted or has a substituent, and a tolyl group that is unsubstituted or has a substituent are preferable.

Examples of the substituent that the monovalent substituent represented by $R^{22}$ may have include groups represented by the following structural formulas, among which any of (d-1), (d-4), or (d-5) is preferable.

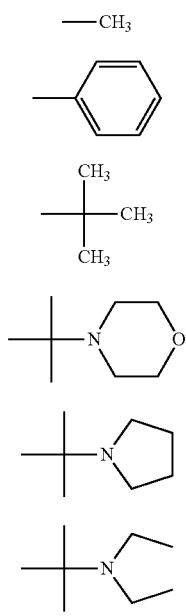

Examples of the divalent linking group represented by $A^{22}$ include an alkylene group having from 1 to 12 carbon atoms that may have a substituent, a cyclohexylene group that may have a substituent, and an alkynylene group that may have a substituent.

Examples of substituents that may be introduced to these groups include: halogen atoms such as a fluorine atom, a chlorine atom, a bromine atom, and an iodine atom; alkoxy groups such as a methoxy group, an ethoxy group, and a tert-butoxy group; aryloxy groups such as a phenoxy group and a p-tolyloxy group; and alkoxycarbonyl groups such as a methoxycarbonyl group, a butoxycarbonyl group, and a phenoxycarbonyl group.

Among these, from the viewpoints of increasing sensitivity and suppressing coloring due to heating or lapse of time, $A^{22}$ preferably represents an unsubstituted alkylene group; an alkylene group substituted by an alkyl group (for example, a methyl group, an ethyl group, a tert-butyl group, or a dodecyl group), an alkylene group substituted by an alkenyl group (for example, a vinyl group or an allyl group), or an alkylene group substituted by an aryl group (for example, a phenyl group, a p-tolyl group, a xylyl group, a cumenyl group, a naphthyl group, an anthryl group, a phenanthryl group, or a styryl group).

The aryl group represented by Ar is preferably an aryl group having from 6 to 30 carbon atoms, and the aryl group may have a substituent. Specifically, examples of Ar include a phenyl group, a biphenyl group, a 1-naphthyl group, a 2-naphthyl group, a terphenyl group, a quarter phenyl group, an o-tolyl group, a m-tolyl group, a p-tolyl group, a xylyl group, an o-cumenyl group, an m-cumenyl group, a p-cumenyl group, and a mesityl group. Among these, from the viewpoints of increasing sensitivity and suppressing coloring due to heating or lapse of time, a substituted or unsubstituted phenyl group is preferable.

In a case in which the phenyl group has a substituent, examples of the substituent include: halogen atoms such as a fluorine atom, a chlorine atom, a bromine atom, and an iodine atom; alkoxy groups such as a methoxy group, an ethoxy group, and a tert-butoxy group; aryloxy groups such as a phenoxy group and a p-tolyloxy group; alkoxycarbonyl groups such as a methoxycarbonyl group, a butoxycarbonyl group, and a phenoxycarbonyl group; acyloxy groups such as an acetoxy group, a propionyloxy group, and a benzoyloxy group; acyl groups such as an acetyl group, a benzoyl group, an isobutyryl group, an acryloyl group, a methacryloyl group, and a methoxalyl group; alkylamino groups such as a methyl amino group and a cyclohexylamino group; dialkylamino groups such as a dimethylamino group, a diethylamino group, a morpholino group, and a piperidino group; a phenylamino group; alkyl groups such as a methyl group, an ethyl group, a tert-butyl group, and a dodecyl group; a hydroxy group; and a carboxy group.

In Formula (4), it is preferable that the structure of SAr formed by Ar and S adjacent to Ar is a structure any of the structures listed below, from the viewpoint of sensitivity.

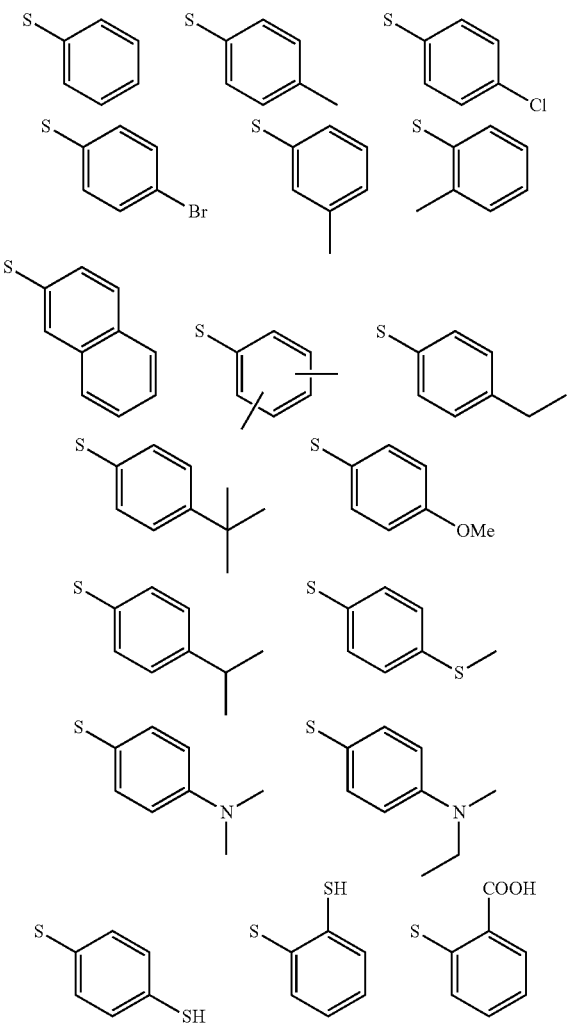

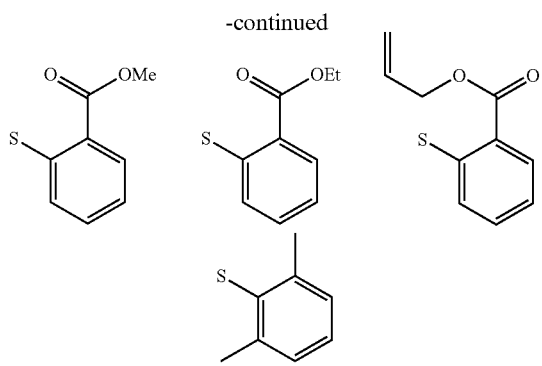

Examples of the monovalent substituent represented by $X^{22}$ include an alkyl group that may have a substituent, an aryl group that may have a substituent, an alkenyl group that may have a substituent, an alkynyl group that may have a substituent, an alkoxy group that may have a substituent, an aryloxy group that may have a substituent, an alkylthiooxy group that may have a substituent, an arylthiooxy group that may have a substituent, a halogen atom, a halogenated alkyl group that may have a substituent, an amino group that may have a substituent, and an amido group that may have a substituent on the nitrogen atom.

The alkyl group that may have a substituent is preferably an alkyl group having from 1 to 30 carbon atoms, examples of which include a methyl group, an ethyl group, a propyl group, a butyl group, a hexyl group, a cyclopentyl group, a cyclohexyl group, a trifluoromethyl group, a 2-ethylhexyl group, and a phenacyl group.

The aryl group that may have a substituent is preferably an aryl group having from 6 to 30 carbon atoms, examples of which include a phenyl group, a biphenyl group, a 1-naphthyl group, a 2-naphthyl group, a terphenyl group, a quater phenyl group, an o-tolyl group, a m-tolyl group, a p-tolyl group, and a xylyl group.

The alkenyl group that may have a substituent is preferably an alkenyl group having from 2 to 10 carbon atoms, examples of which include a vinyl group, an allyl group, and a styryl group.

The alkynyl group that may have a substituent is preferably an alkynyl group having from 2 to 10 carbon atoms, examples of which include an ethynyl group, a propynyl group, and a propargyl group.

The alkoxy group that may have a substituent is preferably an alkoxy group having from 1 to 30 carbon atoms, examples of which include a methoxy group, an ethoxy group, a propyloxy group, an isopropyloxy group, a butoxy group, and a benzyloxy group.

The aryloxy group that may have a substituent is preferably an aryloxy group having from 6 to 30 carbon atoms, examples of which include a phenyloxy group, a 1-naphthyloxy group, a 2-naphthyloxy group, a 2-chlorophenyloxy group, a 2-methylphenyloxy group, and a 2-methoxyphenyloxy group.

The alkylthiooxy group that may have a substituent is preferably a thioalkoxy group having from 1 to 30 carbon atoms, examples of which include a methylthiooxy group, an ethylthiooxy group, a propylthiooxy group, an isopropylthiooxy group, a butylthiooxy group, an isobutylthiooxy group, a sec-butylthiooxy group, a tert-butylthiooxy group, a pentylthiooxy group, an isopentylthiooxy group, a hexylthiooxy group, a heptylthiooxy group, an octylthiooxy group, a 2-ethylhexylthiooxy group, a decylthiooxy group, a dodecylthiooxy group, an octadecylthiooxy group, and a benzylthiooxy group.

The arylthiooxy group that may have a substituent is preferably an arylthiooxy group having from 6 to 30 carbon atoms, examples of which include a phenylthiooxy group, a 1-naphthylthiooxy group, a 2-naphthylthiooxy group, a 2-chlorophenylthiooxy group, a 2-methylphenylthiooxy group, a 2-methoxyphenylthiooxy group, a 2-butoxyphenylthiooxy group, a 3-chlorophenylthiooxy group, a 3-trifluoromethylphenylthiooxy group, a 3-cyanophenylthiooxy group, a 3-nitrophenylthiooxy group, a 4-fluorophenylthiooxy group, a 4-cyanophenylthiooxy group, a 4-methoxyphenylthiooxy group, a 4-dimethylaminophenylthiooxy group, a 4-methylsulfanylphenylthiooxy group, and a 4-phenylsulfanylphenylthiooxy group.

Examples of the halogen atom include a fluorine atom, a chlorine atom, a bromine atom, and an iodine atom.

Examples of the halogenated alkyl group that may have a substituent include a monofluoromethyl group, a difluoromethyl group, a trifluoromethyl group, a dichloromethyl group, a trichloromethyl group, a monobromomethyl group, a dibromomethyl group, and a tribromomethyl group.

Examples of the amido group that may have a substituent on the nitrogen atom include an N,N-dimethyl amido group and an N,N-diethylamido group.

Among these, from the viewpoint of improving solubility in solvents and absorption efficiency in a long-wavelength region, $X^{22}$ preferably represents an alkyl group that may have a substituent, an aryl group that may have a substituent, an alkenyl group that may have a substituent, an alkynyl group that may have a substituent, an alkoxy group that may have a substituent, an aryloxy group that may have a substituent, an alkylthiooxy group that may have a substituent, an arylthiooxy group that may have a substituent, a halogenated alkyl group that may have a substituent, an amino group that may have a substituent, or an amido group that may have a substituent on the nitrogen atom. In particular, $X^{22}$ more preferably represents an alkyl group that may have a substituent.

In Formula (4), n represents an integer from 0 to 5. From the viewpoint of ease of synthesis, n preferably represents an integer from 0 to 3, and more preferably represents an integer from 0 to 2. In Formula (4), in a case in which plural $X^{22}$s are present, the plural $X^{22}$s may be the same as each other or different from each other.

Specific examples of the oxime photopolymerization initiator represented by Formula (4) include those illustrated below.

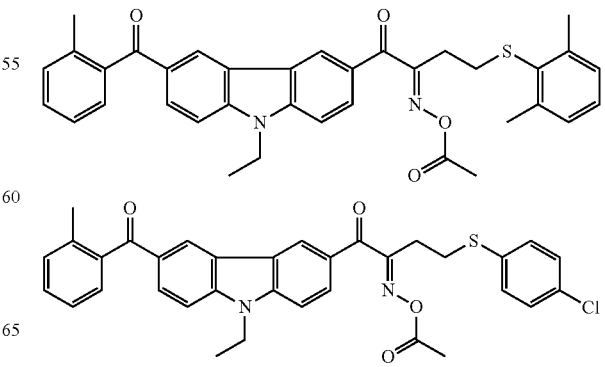

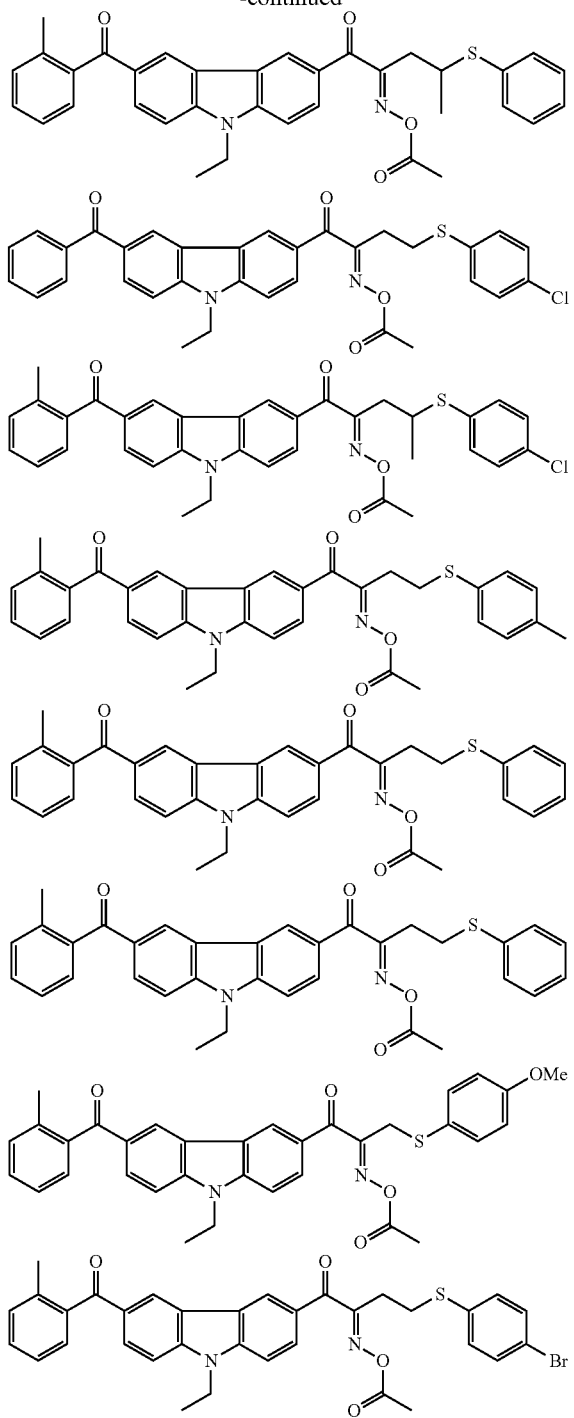

Among those described above, the oxime compound represented by Formula (4) preferably has a structure in which $R^{22}$ represents an acyl group, $A^{22}$ represents an alkylene group, Ar represents a substituted or unsubstituted phenyl group, $X^{22}$ represents an alkyl group, and n represents an integer from 0 to 3, and more preferably has a structure in which $R^{22}$ represents an acetyl group, $A^{22}$ represents an ethylene group or a propylene group, Ar represents a phenyl group, a 4-methyl phenyl group, a 4-chlorophenyl group, a 4-methoxy phenyl group, or a 4-bromo phenyl group, $X^{22}$ represents a methyl group, and n represents an integer from 0 to 2.

The compound represented by Formula (4) has an absorption wavelength in the wavelength range of from 250 nm to 500 nm. More preferable examples of the compound include those having an absorption wavelength in the wavelength range of from 300 nm to 380 nm. In particular, those having high absorbance at 308 nm and 355 nm are preferable.

The photopolymerization initiator may be used singly or in combination of two or more thereof. In a case in which two or more photopolymerization initiators are used in combination, plural compounds represented by Formula (3) may be selected and used, or plural compounds represented by Formula (4) may be selected and used. In another embodiment, at least one compound represented by Formula (3) and at least one compound represented by Formula (4) are selected and used. In another embodiment, at least one compound represented by Formula (3) or Formula (4) may be used together with an oxime compound other than the compounds represented by Formula (3) or Formula (4) or together with a photopolymerization initiator other than oxime compounds. In addition, a sensitizer may also be used together with a photopolymerization initiator.

The total content of photopolymerization initiator in the colored photosensitive composition is preferably from 0.1% by mass to 20% by mass with respect to the total solid content of the colored photosensitive composition, more preferably from 0.5% by mass to 10% by mass with respect to the total solid content of the colored photosensitive composition, and most preferably from 1% by mass to 5% by mass with respect to the total solid content of the colored photosensitive composition. When the total content of the photopolymerization initiator is within this range, the sensitivity at the time of exposure to light is high, and the color properties are also excellent.

Sensitizer

The colored photosensitive composition according to the invention may further include a sensitizer.

Examples of typical sensitizers include those disclosed in Crivello [J. V. Crivello, *Adv. in Polymer Sci,* 62, 1 (1984)]. Specific examples of sensitizers include pyrene, perylene, acridine, thioxanthone, 2-chlorothioxanthone, benzoflavin, N-vinylcarbazole, 9,10-dibutoxyanthracene, anthraquinone, benzophenone, coumarin, ketocoumarin, phenanthrene, camphorquinone, and phenothiazine derivatives. The sensitizer may be added preferably at a ratio of from 50% by mass to 200% by mass with respect to the photopolymerization initiator.

(D) Polymerizable Compound

The colored photosensitive composition according to the invention includes at least one polymerizable compound.

For example, a compound having polymerizability and including at least one ethylenically unsaturated double bond may be used as a polymerizable compound. Due to the inclusion of the polymerizable compound, a cured colored pattern (for example, a color filter) can be obtained when the colored photosensitive composition is patternwise exposed to light.

The polymerizable compound to be used may be selected from components contained in known compositions, and examples thereof include substances disclosed in paragraphs to [0020] of JP-A No. 2006-23696 and substances disclosed in paragraphs [0027] to [0053] of JP-A No. 2006-64921. In addition, preferable examples of polymerizable compounds include: urethane-addition polymerizable compounds produced using an addition reaction between an isocyanate and a hydroxy group; urethane acrylates disclosed in JP-A No. S51-37193, Japanese Patent Publication (JP-B) No. H02-32293, and JP-B No. H02-16765; and urethane compounds having an ethylene oxide skeleton and disclosed in JP-B No.

558-49860, JP-B No. S56-17654, JP-B No. S62-39417, and JP-B No. S62-39418. Further examples include polyester acrylates disclosed in JP-A No. S48-64183, JP-B No. S49-43191, and JP-B No. S52-30490, and multifunctional acrylates and methacrylates, such as epoxy acrylates, that are obtained by a reaction between an epoxy resin and (meth) acrylic acid. Still further examples of polymerizable compounds that can be used include the polymerizable compounds that are introduced as photosetting monomers and oligomers in the *Journal of the Adhesion Society of Japan* vol. 20, No. 7 (1984), pages 300 to 308.

Specific examples of polymerizable compounds include pentaerythritol tri(meth)acrylate, pentaerythritol tetra(meth)acrylate, dipentaerythritol penta(meth)acrylate, dipentaerythritol hexa(meth)acrylate, tri((meth)acryloyloxyethyl) isocyanurate, a pentaerythritol tetra(meth)acrylate EO-modified product, and a dipentaerythritol hexa(meth)acrylate EO-modified product. In addition, preferable examples of commercially available products include: NK ESTER A-TMMT, NK ESTER A-TMM-3, NK OLIGO UA-32P, AND NK OLIGO UA-7200 (all of which are trade names, and produced by Shin-Nakamura Chemical Co., Ltd.); KAYARAD DPHA (trade name, produced by Nippon Kayaku Co., Ltd.), ARONIX M-305, ARONIX M-306, ARONIX M-309, ARONIX M-450, ARONIX M-402, ARONIX TO-1382, AND ARONIX TO-2349 (all of which are trade names, and produced by Toagosei Co., Ltd.); and V#802 (trade name, produced by Osaka Organic Chemical Industry Ltd.).

The polymerizable compound may be used singly or in combination of two or more thereof.

The content of the polymerizable compound in the colored photosensitive composition (the total content in a case in which the colored photosensitive composition includes two or more polymerizable compounds) is preferably 10% by mass to 80% by mass with respect to the total solid content of the colored photosensitive composition, more preferably 15% by mass to 75% by mass with respect to the total solid content of the colored photosensitive composition, and particularly preferably 20% by mass to 60% by mass with respect to the total solid content of the colored photosensitive composition.

The colored photosensitive composition according to the invention may further include an alkali-soluble resin, a chain transfer agent, a polymerization inhibitor, an organic solvent, a surfactant, an adhesion improving agent, a cross-linking agent, a development accelerator, and other additives, as necessary. These components are briefly described below.

Alkali-Soluble Resin

The alkali-soluble resin (hereinafter also referred to as an "alkali-soluble binder") is not particularly limited except for possession of alkali solubility, and the alkali-soluble resin may be preferably selected from the viewpoints such as heat resistance, developability, and availability.

The alkali-soluble resin is preferably a linear organic high-molecular-weight polymer that is soluble in an organic solvent and developable in a weakly alkaline aqueous solution. The linear organic high-molecular-weight polymer may be, for example, a polymer having a carboxylic acid in a side chain thereof, examples of which include methacrylic acid copolymers, acrylic acid copolymers, itaconic acid copolymers, crotonic acid copolymers, maleic acid copolymers, and partially-esterified maleic acid copolymers, which are disclosed in JP-A No. S59-44615, JP-B No. S54-34327, JP-B No. S58-12577, JP-B No. S54-25957, JP-A No. S59-53836, and JP-A No. S59-71048. Acidic cellulose derivatives having a carboxylic acid in a side chain thereof are also useful.

In addition to those mentioned above, products obtained by adding an acid anhydride to a polymer having a hydroxy group, and polyhydroxystyrene-based resins, polysiloxane-based resins, poly(2-hydroxyethyl(meth)acrylate), polyvinylpyrrolidone, polyethylene oxide, polyvinyl alcohol, and the like are also useful as alkali-soluble resins. The linear organic high-molecular-weight polymer may be a product obtained by copolymerizing a monomer having hydrophilicity. Examples thereof include alkoxyalkyl(meth)acrylate, hydroxyalkyl(meth)acrylate, glycerol(meth)acrylate, (meth)acrylamide, N-methylol acrylamide, secondary or tertiary alkyl acrylamide, dialkylamino alkyl(meth)acrylate, morpholine(meth)acrylate, N-vinylpyrrolidone, N-vinylcaprolactam, vinylimidazole, vinyltriazole, methyl(meth)acrylate, ethyl(meth)acrylate, branched or straight-chain propyl(meth)acrylate, branched or straight-chain butyl(meth)acrylate, and phenoxy hydroxypropyl(meth)acrylate. Monomers including a tetrahydrofurfuryl group, a phosphoric acid group, a phosphoric acid ester group, a quaternary ammonium salt group, an ethyleneoxy chain, a propyleneoxy chain, a sulfonic acid group, a group derived a salt of a sulfonic acid, a morpholinoethyl group, and the like are also useful as monomers having hydrophilicity.

In order to improve the cross-linking efficiency, the alkali-soluble resin may be configured to have a polymerizable group in a side chain thereof; for example, polymers that include an allyl group, a (meth)acrylic group, an allyloxy alkyl group, or the like in a side chain thereof are also useful. Examples of the polymer that includes a polymerizable group include: DIANAL NR series (trade name, produced by Mitsubishi Rayon Co., Ltd.); PHOTOMER 6173 (trade name, COOH-containing polyurethane acrylic oligomer, produced by Diamond Shamrock Co. Ltd.); VISCOAT R-264 and KS resist 106 (all trade names, produced by Osaka Organic Chemical Industry Ltd.); CYCLOMER P series and PLACCEL CF200 series (all trade names, produced by Daicel Chemical Industries, Ltd.); and EBECRYL 3800 (trade name, produced by Daicel-UCB Co., Ltd.). Alcohol-soluble NYLONs, polyethers of 2,2-bis-(4-hydroxyphenyl)-propane and epichlorohydrin, and the like are also useful from the viewpoint of increasing the strength of a cured coating film.

Among the various types of alkali-soluble resins, polyhydroxystyrene-based resins, polysiloxane-based resins, acrylic-based resins, acrylamide-based resins, and acrylic/acrylamide copolymer resins are preferable from the viewpoint of heat resistance, and acrylic-based resins, acrylamide-based resins, and acrylic/acrylamide copolymer resins are preferable from the viewpoint of the regulation of developability.

Copolymers formed of monomers selected from the group consisting of benzyl(meth)acrylate, (meth)acrylic acid, hydroxyethyl(meth)acrylate, (meth)acrylamide, and the like, and PHOTOMER 6173, KS RESIST-106, CYCLOMER P series, and the like mentioned above, are preferable as the acrylic-based resin.

From the viewpoints of, for example, developability and liquid viscosity, the alkali-soluble resin is preferably a polymer having a weight average molecular weight (polystyrene-equivalent value as measured by the GPC method) of from 1000 to $2 \times 10^5$, more preferably a polymer having a weight average molecular weight of from 2000 to $1 \times 10^5$, and particularly preferably a polymer having a weight average molecular weight of from 5000 to $5 \times 10^4$. The alkali-soluble resin may be used singly, or in combination of two or more thereof.

Chain Transfer Agent

A chain transfer agent may be added to the colored photosensitive composition according to the invention. Examples of the chain transfer agent include alkyl N,N-dialkylaminobenzoates such as ethyl N,N-dimethylaminobenzoate, and mercapto compounds having a heterocyclic ring such as 2-mercaptobenzothiazole, 2-mercaptobenzoxazole, 2-mercaptobenzimidazole, and N-phenyl mercapto benzimidazole.

The chain transfer agent may be used singly, or in combination of two or more thereof.

From the viewpoint of reducing variations in sensitivity, the amount of chain transfer agent to be added is preferably in a range of from 0.01% by mass to 15% by mass with respect to the total solid content of the colored photosensitive composition according to the invention, more preferably from 0.1% by mass to 10% by mass with respect to the total solid content of the colored photosensitive composition, and particularly preferably from 0.5% by mass to 5% by mass with respect to the total solid content of the colored photosensitive composition.

Polymerization Inhibitor

The colored photosensitive composition according to the invention may contain a polymerization inhibitor. The polymerization inhibitor is a substance that performs hydrogen donation (or hydrogen transfer), energy donation (or energy transfer), electron donation (or electron transfer), or the like to a polymerization initiating species, such as a radical, generated in the colored photosensitive composition by light or heat, thereby deactivating the polymerization initiating species and suppressing unintended initiation of polymerization. Polymerization inhibitors disclosed in paragraphs [0154] to [0173] of JP-A No. 2007-334322 and the like may be used as polymerization inhibitors. In particular, p-methoxyphenol is preferable as a polymerization inhibitor.

The content of polymerization inhibitor in the colored photosensitive composition according to the invention is preferably 0.0001 to 5% by mass with respect to the total mass of the polymerizable compound, more preferably 0.001 to 5% by mass with respect to the total mass of the polymerizable compound, and particularly preferably 0.001 to 1% by mass with respect to the total mass of the polymerizable compound.

Organic Solvent

The colored photosensitive composition according to the invention may include an organic solvent.

Basically, the organic solvent is not particular limited as long as the organic solvent provides satisfactory solubility of the coexisting components and satisfactory coating properties of the colored photosensitive composition. The organic solvent is preferably selected in consideration of, particularly, the solubility of solid components, coating properties, and safety.

Preferable examples of organic solvents include:

esters, such as ethyl acetate, n-butyl acetate, isobutyl acetate, amyl formate, isoamyl acetate, isobutyl acetate, butyl propionate, isopropyl butyrate, ethyl butyrate, butyl butyrate, methyl lactate, ethyl lactate, alkyl oxyacetates (for example, methyl oxyacetate, ethyl oxyacetate, butyl oxyacetate (specific examples thereof including methyl methoxyacetate, ethyl methoxyacetate, butyl methoxyacetate, methyl ethoxyacetate, and ethyl ethoxyacetate)), alkyl 3-oxypropionates, alkyl 2-oxypropionates, methyl 2-oxy-2-methylpropionate, ethyl 2-oxy-2-methylpropionate, methyl pyruvate, ethyl pyruvate, propyl pyruvate, methyl acetoacetate, ethyl acetoacetate, methyl 2-oxobutanoate, and ethyl 2-oxobutanoate;

ethers, such as diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, and propylene glycol monopropyl ether acetate;

ketones, such as methyl ethyl ketone, cyclohexanone, 2-heptanone, and 3-heptanone; and aromatic hydrocarbons, such as toluene and xylene.

From the viewpoints of the solubility of the components described above, the solubility of an alkali-soluble resin, if any, and improvement of the state of the coating surface, it is also preferable to mix two or more of these organic solvents. In this case, a mixed solution composed of two or more selected from the group consisting of methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethylcarbitol acetate, butylcarbitol acetate, propylene glycol methyl ether, and propylene glycol methyl ether acetate is particularly preferable.

The content of organic solvent in the colored photosensitive composition is preferably an amount that provides a total solid concentration in the colored photosensitive composition of from 10% by mass to 80% by mass, and more preferably an amount that provides a total solid concentration in the colored photosensitive composition of from 15% by mass to 60% by mass.

Surfactant

The colored photosensitive composition according to the invention may include a surfactant.

Any of an anionic surfactant, a cationic surfactant, a nonionic surfactant, or an amphoteric surfactant may be used. Nonionic surfactants are preferable. Specifically, examples of nonionic surfactants include nonionic surfactants disclosed in paragraph [0058] of JP-A No. 2009-098616, and fluorine-based surfactants are particularly preferable.

Examples of surfactants include MEGAFACE F142D, MEGAFACE F172, MEGAFACE F173, MEGAFACE F176, MEGAFACE F177, MEGAFACE F183, MEGAFACE F479, MEGAFACE F482, MEGAFACE F554, MEGAFACE F780, MEGAFACE F781, MEGAFACE F781-F, MEGAFACE R30, MEGAFACE R08, MEGAFACE F-472SF, MEGAFACE BL20, MEGAFACE R-61, and MEGAFACE R-90 (all trade names; produced by DIC Corporation), FLUORAD FC-135, FLUORAD FC-170C, FLUORAD FC-430, FLUORAD FC-431, and NOVEC FC-4430 (all trade names; produced by Sumitomo 3M Ltd.), ASAHI GUARD AG7105, 7000, 950, 7600, SURFLON S-112, SURFLON S-113, SURFLON S-131, SURFLON S-141, SURFLON S-145, SURFLON S-382, SURFLON SC-101, SURFLON SC-102, SURFLON SC-103, SURFLON SC-104, SURFLON SC-105, and SURFLON SC-106 (all trade names; produced by Asahi Glass Co., Ltd.), F TOP EF351, F TOP 352, F TOP 801, and F TOP 802 (all trade names; produced by Mitsubishi Materials Electronic Chemicals Co., Ltd.), and FTERGENT 250 (trade name; produced by Neos Corporation), which are commercially available products.

A preferable example of the surfactant is a copolymer which include a constituent unit A and a constituent unit B that are shown in the following Formula (W) and of which the polystyrene-equivalent weight average molecular weight (Mw) as measured by gel permeation chromatography using tetrahydrofuran as a solvent is within a range of from 1,000 to 10,000.

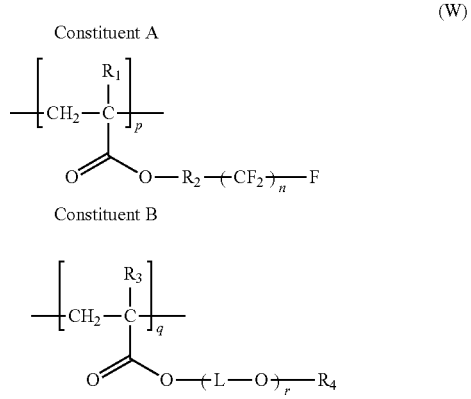

(W)
Constituent A
Constituent B

In Formula (W), each of $R^1$ and $R^3$ independently represents a hydrogen atom or a methyl group; $R^2$ represents a straight-chain alkylene group having from 1 to 4 carbon atoms; $R^4$ represents a hydrogen atom or an alkyl group having from 1 to 4 carbon atoms; L represents an alkylene group having from 3 or 6 carbon atoms; p and q represent percentages by mass that represent polymerization ratios, p represents a number of from 10% by mass to 80% by mass, and q represents a number of from 20% by mass to 90% by mass; r represents an integer from 1 to 18; and n represents an integer from 1 to 10.

L preferably represents a branched alkylene group represented by the following formula (W-2). $R^5$ in formula (W-2) represents an alkyl group having from 1 to 4 carbon atoms. From the viewpoints of compatibility and wettability on a surface to be coated, $R^5$ preferably represents an alkyl group having from 1 to 3 carbon atoms, and more preferably represents an alkyl group having 2 or 3 carbon atoms. The sum of p and q in formula (W) (p+q) preferable satisfies the equation, p+q=100; in other words, the sum is preferably 100% by mass.

The weight average molecular weight (Mw) of the copolymer is more preferably from 1,500 to 5,000.

(W-2)

These surfactants may be used singly, or in combination of two or more thereof.

The amount of surfactant to be included in the colored photosensitive composition according to the invention is preferably 0.01% by mass to 2.0% by mass with respect to the total solid content of the colored photosensitive composition, and particularly preferably 0.02% by mass to 1.0% by mass with respect to the total solid content of the colored photosensitive composition. When the amount of surfactant is within this range, coating properties and the uniformity of a cured film are improved.

Adhesion Improving Agent

The colored photosensitive composition according to the invention may include an adhesion improving agent.

The adhesion improving agent is a compound that improves the adhesion between a cured film of the colored photosensitive composition layer and an inorganic material serving as a support, for example, a silicon compound such as glass, silicon, silicon oxide, or silicon nitride, gold, copper, or aluminum. Specifically, an example of an adhesion improving agent is a silane coupling agent. The silane coupling agent serving as an adhesion improving agent is used with a view to modifying the properties of the interface, and known silane coupling agents can be used without particularly restrictions.

Silane coupling agents disclosed in paragraph [0048] of JP-A No. 2009-98616 are preferable as silane coupling agents, and, particularly, γ-glycidoxypropyl trialkoxysilane and γ-methacryloxypropyl trialkoxysilane are more preferable. These silane coupling agents may be used singly, or in combination of two or more thereof.

The content of adhesion improving agent in the colored photosensitive composition according to the invention is preferably 0.1% by mass to 20% by mass with respect to the total solid content of the colored photosensitive composition, and more preferably 0.2% by mass to 5% by mass with respect to the total solid content of the colored photosensitive composition.

Cross-Linking Agent

A cross-linking agent may be supplementarily used in the colored photosensitive composition according to the invention, so as to further increase the hardness of a colored layer formed by curing the colored photosensitive composition.

The cross-linking agent is not particularly limited as long as the cross-linking agent is able to cure a film through a cross-linking reaction. Examples of cross-linking agents include: (a) an epoxy resin; (b) a melamine compound, guanamine compound, glycoluril compound, or urea compound substituted by at least one substituent selected from the group consisting of a methylol group, an alkoxy methyl group, and an acyloxymethyl group; and (c) a phenolic compound, naphthol compound, or hydroxy anthracene compound substituted by at least one substituent selected from the group consisting of a methylol group, an alkoxy methyl group, and an acyloxymethyl group. Among these, a multifunctional epoxy resin is preferable.

In regard to the specifics of the cross-linking agent, such as specific examples thereof, the disclosure of paragraphs [0134] to [0147] of JP-A No. 2004-295116 may be referenced.

Development Accelerator

A development accelerator may be added in order to promote the alkali solubility of unexposed regions after the colored photosensitive composition layer is exposed to light, and thus improve the developability of the colored photosensitive composition. The development accelerator is preferably a low-molecular-weight organic carboxylic acid compound having a molecular weight of 1,000 or less, or a low-molecular-weight phenolic compound having a molecular weight of 1,000 or less.

Specific examples of development accelerators include: aliphatic monocarboxylic acids such as formic acid, acetic acid, propionic acid, butyric acid, valeric acid, pivalic acid, caproic acid, diethylacetic acid, enanthoic acid, and caprylic acid; aliphatic dicarboxylic acids such as oxalic acid, malonic acid, succinic acid, glutaric acid, adipic acid, pimelic acid, suberic acid, azelaic acid, sebacic acid, brassylic acid, methylmalonic acid, ethylmalonic acid, dimethylmalonic acid, methylsuccinic acid, tetramethylsuccinic acid, and citraconic acid; aliphatic tricarboxylic acids such as tricarballylic acid, aconitic acid, and camphoronic acid; aromatic monocarboxylic acids such as benzoic acid, toluic acid, cuminic acid, hemellitic acid, and mesitylenic acid; aromatic polycarboxylic acids such as phthalic acid, isophthalic acid, terephthalic acid, trimellitic acid, trimesic acid, mellophanic acid, and pyromellitic acid; phenylacetate; hydratropic acid; hydrocinnamic acid; mandelic acid; phenylsuccinic acid; atropic acid;

cinnamic acid; methyl cinnamate; benzyl cinnamate; cinnamylidene acetic acid; coumaric acid; and umbellic acid.

Other Additives

The colored photosensitive composition according to the invention may further include various additives, as necessary, such as fillers, polymer compounds other than those described above, ultraviolet absorbers, and antioxidants. Examples of these additives include those disclosed in paragraphs [0155] to [0156] of JP-A No. 2004-295116. The colored photosensitive composition according to the invention may include light stabilizers disclosed in paragraph [0078] of JP-A No. 2004-295116 and thermal polymerization inhibitors disclosed in paragraph [0081] of JP-A No. 2004-295116.

Method of Preparing Colored Photosensitive Composition

The colored photosensitive composition according to the invention can be prepared by mixing components described above and, if necessary, other components.

In the preparation of the colored photosensitive composition, the components for forming the colored photosensitive composition may be added at once, or sequentially added after each component is dissolved or dispersed in a solvent. The order of the addition and the working conditions for the addition is not particularly limited. For example, in an embodiment, all components are simultaneously dissolved or dispersed in a solvent to prepare the composition. In another embodiment, the components are divided to form two or more solutions or dispersions, as necessary, and the solutions or dispersions are mixed at the time of use (at the time of application) to form the colored photosensitive composition.

The colored photosensitive composition prepared as described above may be used, preferably after the colored photosensitive composition is filtered using, for example, a filter having an aperture diameter of from 0.01 μm to 3.0 μm.

Color Filter and Method of Producing the Same

The color filter according to the invention has a colored layer that is formed using the aforementioned colored photosensitive composition according to the invention. The color filter according to the invention preferably has a configuration which further includes a support and in which the colored layer is provided on the support. The colored layer on the support is configured to have a colored pattern of, for example, red (R), green (G), and blue (B), the colored pattern forming pixels of the color filter.

The method of producing a color filter according to the invention includes:

a colored layer formation process (A) (hereinafter simply referred to as "process (A)") of forming a colored layer (a colored photosensitive composition layer) by applying the colored photosensitive composition described above to a support;

an exposure process (B) (hereinafter simply referred to as "process (B)") of forming a latent image by patternwise exposing the colored layer formed through process (A) to light; and a development process (C) (hereinafter simply referred to as "process (C)") of forming a pattern by developing the colored layer on which the latent image has been formed. In addition, the method of producing a color filter according to the invention particularly preferably further includes a heating process (D) hereinafter (simply referred to as "process (D)") of subjecting the colored pattern, which has been obtained through process (C), to heating treatment.

The method of producing a color filter according to the invention is more specifically described below.

Process (A)

In the method of producing a color filter according to the invention, first, the aforementioned colored photosensitive composition according to the invention is applied to a support using a coating method such as spin coating, slit coating, cast coating, roll coating, bar coating, or ink-jetting, so as to form a colored layer, and then the colored layer is dried by, for example, heating (pre-baking) or vacuum drying.

Examples of the support include soda glass, alkali-free glass, borosilicate glass, quartz glass, silicon substrates, and resin substrates, which are used in liquid crystal display devices. An undercoat layer may be provided on the support, as necessary, with a view to improving the adhesion to an upper layer, preventing diffusion of substances, or flattening the surface.

The conditions for the pre-baking may be conditions including heating at a temperature of from 70° C. to 130° C. for a period of from about 0.5 minutes to 15 minutes using a hot plate or an oven.

The thickness of the colored layer formed from the colored photosensitive composition is appropriately selected in accordance with the purpose. In color filters for liquid crystal display devices, a thickness within a range of from 0.2 μm to 5.0 μm is preferable, and a thickness within a range of from 1.0 μm to 4.0 μm is more preferable. Here, the thickness of the colored layer means a film thickness after drying.

Process (B)

In the method of producing a color filter according to the invention, subsequent to process (A), the colored layer formed on the support is patternwise exposed to light. In regard to the light or radiation applicable to the exposure to light, g-line, h-line, i-line, and various types of laser light are preferable, and i-line is particularly preferable. In a case in which i-line is used for irradiation, irradiation is performed preferably in an exposure amount of from 5 mJ/cm$^2$ to 500 mJ/cm$^2$.

Other exposure light sources that can be used include ultra-high pressure mercury lamps, high pressure mercury lamps, medium pressure mercury lamps, low-pressure mercury lamps, chemical lamps, carbon arc lamps, xenon lamps, metal halide lamps, and various types of laser light sources.

Exposure Process Using Laser Light Source

In an exposure system in which a laser light source is used, the irradiation light is preferably an ultraviolet laser having a wavelength within a range of from 300 nm to 410 nm, more preferably having a wavelength within a range of from 300 nm to 360 nm. Specifically, a third harmonic wave (355 nm) of an Nd:YAG laser, which is a solid laser, and XeCl (308 nm) and XeF (353 nm), which are excimer lasers, may be used, which have particularly large output and which are relatively inexpensive. From the viewpoint of productivity, the patternwise exposure amount is preferably within a range of from 1 mJ/cm$^2$ to 100 mJ/cm$^2$, and more preferably within a range of from 1 mJ/cm$^2$ to 50 mJ/cm$^2$.

The exposure apparatus is not particularly limited. Commercially-available exposure apparatuses that can be used include CALLISTO (trade name; produced by V-Technology Co., Ltd.), EGIS (produced by V-Technology Co., Ltd.), and DF2200G (trade name; produced by Dainippon Screen Manufacturing Co., Ltd.). Other apparatuses than those described above can also be used suitably.

Process (C)

Subsequently, the colored layer after the exposure to light is developed using a developer solution. As a result of the development, a colored pattern can be formed. Alkaline aqueous solutions and various combinations of organic solvents may be used as developer solutions as long as the developer solutions dissolve uncured portions of the colored layer but do not dissolve cured portions. In a case in which the developer solution is an alkaline aqueous solution, the alkali concentration is preferably adjusted to provide a pH of from 10 to 13. Examples of the alkaline aqueous solution include alkaline aqueous solutions of sodium hydroxide, potassium hydroxide, sodium carbonate, sodium hydrogen carbonate, sodium silicate, sodium metasilicate, aqueous ammonia, ethylamine, diethylamine, dimethyl ethanol amine, tetramethyl ammonium hydroxide, tetraethyl ammonium hydroxide, choline, pyrrole, piperidine, 1,8-diazabicyclo-[5,4,0]-7-undecene, or the like.

The development time is preferably within a range of from 30 seconds to 300 seconds, and more preferably within a range of from 30 seconds to 120 seconds. The developing temperature is preferably within a range of from 20° C. to 40° C., and more preferably 23° C.

The development may be carried out using a puddle method, a shower method, a spray method, or the like.

After the development using an alkaline aqueous solution, washing with water is preferably carried out.

In the method of producing a color filter according to the invention, in particular, it is also preferable to subject the colored pattern (pixels), which has been formed using the colored photosensitive composition, to post-exposure that involves irradiation with ultraviolet rays.

—Process (D)—

The colored pattern after development, or the colored pattern that has been subjected to post-exposure involving irradiation with ultraviolet rays, is preferably further subjected to heating treatment. Heating treatment on the formed color pattern (so-called post-baking) can further cure the colored pattern. The heating treatment can be performed using, for example, a hot plate, any of various types of heaters, or an oven.

The temperature of the heating treatment is preferably within a range of from 100° C. to 300° C., and more preferably within a range of from 150° C. to 250° C. The heating time is preferably within a range of from about 10 minutes to about 120 minutes.

The colored pattern thus obtained forms the pixels of a color filter. In order to produce a color filter having pixels of plural hues, process (A), process (B), process (C), and, if necessary, process (D) may be repeated for the number of times corresponding to the desired number of colors.

Here, process (D) may be performed every time the formation, exposure, and development of a colored layer of a single color are finished (i.e., for each color), or performed at once after the formation, exposure, and development of the colored layers of all of the desired number of colors are finished.

Since the colored photosensitive composition according to the invention is used in the color filter according to the invention (preferably a color filter obtained using the method of producing a color filter according to the invention), the color filter has excellent hue and excellent contrast, the elution of metal ions is suppressed, and the specific resistance of the liquid crystal is favorably maintained in a case in which the color filter is used in a liquid crystal display device. In a case in which the color filter according to the invention is used in a liquid crystal display device or the like, excellent hue is achieved, and excellent spectral characteristics and excellent contrast are obtained; therefore, images having excellent image quality can be displayed.

Liquid Crystal Display Device

A liquid crystal display device according to the invention includes the aforementioned color filter according to the invention. The definitions of liquid crystal display devices and details of the individual display devices are described in, for example, *Electronic Display Devices* (Akio Sasaki, Kogyo Chosakai Publishing Co., Ltd.) (1990) and *Display Devices* (Sumiaki Ibuki, Sangyo-Tosho Co., Ltd.) (1989). In addition, liquid crystal display devices are described in, for example, *Next-Generation Liquid Crystal Display Technology* (Edited by Tatsuo Uchida, Kogyo Chosakai Publishing, Co., Ltd.) (1994). There are no particular limitations on the liquid crystal display devices to which the invention can be applied. For example, the invention can be applied to liquid crystal display devices of various methods described in *Next-Generation Liquid Crystal Display Technology* mentioned above.

The color filter according to the invention is effective to, particularly, color thin film transistor (TFT) liquid crystal display devices. Color TFT liquid crystal display devices are described in, for example, *Color TFT Liquid Crystal Displays* (Kyoritsu Shuppan Co., Ltd.) (1996). The invention can be applied also to liquid crystal display devices in which the viewing angle is enlarged, such as an in-plane switching system such as IPS and a pixel division system such as a multi-domain vertical alignment (MVA), and to super twisted nematic (STN), twisted nematic (TN), vertical alignment (VA), optically compensated splay (OCS), fringe field switching (FFS), and reflective optically compensated bend (R-OCB), and the like. The color filter according to the invention can also be applied to a color-filter on array (COA) system.

By using the color filter according to the invention in a liquid crystal display device in combination with a known three-wavelength cold cathode tubes, high contrast can be realized. Further, by using LED light sources of red, green, and blue (RGB-LED) as a backlight, a liquid crystal display device can be provided which has high brightness, excellent color reproducibility, and high color purity.

EXAMPLES

The invention is more specifically described below using examples. However, the invention is not limited to the following examples as long as the gist of the invention is retained. Further, "part(s)" represents part(s) by mass unless specifically noted otherwise.

Example 1

Preparation of Colored Photosensitive Composition

The following components were mixed and dissolved to prepare a colored photosensitive composition.

| | |
|---|---|
| Organic solvent 1 (propylene glycol monomethyl ether acetate) | 33.1 g |
| Organic solvent 2 (ethyl 3-ethoxypropionate) | 25.2 g |
| Alkali-soluble binder 1 (methacrylic acid adduct of a copolymer of cyclohexyl methacrylate, methacrylic acid, and glycidyl methacrylate (= 30:30:40 [molar ratio], 45% by mass solution in propylene glycol monomethyl ether) | 5.8 g |
| Alkali-soluble binder 2 (copolymer of allyl methacrylate and methacrylic acid (= 70:30 [molar ratio], weight average molecular weight: 26,800) | 1.1 g |
| Polymerizable compound 1 (KAYARAD DPHA produced by Nippon Kayaku Co., Ltd.) | 2.8 g |
| Polymerizable compound 2 (ARONIX TO-2349 produced by Toagosei Co., Ltd.) | 2.8 g |
| Polymerization inhibitor (p-methoxyphenol) | 0.003 g |
| Photopolymerization initiator 1 (oxime compound 1: 1-(O-acetyloxime)-1-[9-ethyl-6-(thiophenoyl)-9H-carbazole-3-yl]propanone, which is an oxime-based photopolymerization initiator represented by Formula (3)) | 0.39 g |
| The following multifunctional thiol compound 1 | 0.2 g |

-continued

| | |
|---|---|
| Adhesion improving agent (3-methacryloxypropyl trimethoxy silane) | 0.2 g |
| Fluorine-based surfactant (MEGAFACE F-554 produced by DIC Corporation) | 0.01 g |
| The following yellow pigment dispersion liquid (Pigment Yellow 150 dispersion liquid having a solid content of 24.3% by mass and a pigment concentration of 15.1% by mass) | 27.0 g |
| Dye (A-6) (Exemplary compound of the squarylium compound represented by Formula (1)) | 1.5 g |

Yellow Pigment Dispersion Liquid

The yellow pigment dispersion liquid was prepared in the following manner.

15.1 parts of C. I. Pigment Yellow 150 and 9.2 parts of a dispersant (SOLSPERSE 5500 produced by Nippon Lubrizol Corp.) were mixed with 75.7 parts of propylene glycol monomethyl ether acetate, and the pigment was sufficiently dispersed using a bead mill, whereby a yellow pigment dispersion liquid was obtained.

The specifics of the multifunctional thiol compound used in the preparation of the colored photosensitive composition described above, and the specifics of the multifunctional thiol compounds used in the after-mentioned Examples 2 to 10 and Comparative Examples 1 to 5 are provided below.

Multifunctional thiol compound 1: 1,4-bis(3-mercaptobutyloxy) butane

Multifunctional thiol compound 2: 1,3-bis(3-mercaptobutyloxy) butane

Multifunctional thiol compound 3: 1,3,5-tris(3-mercaptobutyloxyethyl)-1,3,5-triazine-2,4,6(1H,3H,5H)-trione)

Multifunctional thiol compound 4: trimethylolpropane tris(3-mercaptopropionate)

Multifunctional thiol compound 5: pentaerythritol tetrakis(3-mercaptopropionate)

Multifunctional thiol compound 6: dipentaerythritol hexakis (3-mercapto propionate)

Formation of Colored Photosensitive Composition Layer (Colored Layer)

After the colored photosensitive composition prepared as described above was applied to a glass substrate (trade name: #1737; produced by Corning Inc.) using a spin coating method, the colored photosensitive composition was dried at room temperature for 30 minutes to evaporate volatile components, whereby a colored layer A was formed. The colored layer A was irradiated with i-line rays (wavelength: 365 nm), to form a latent image. Here, the light source used for the i-line rays was an ultra-high pressure mercury lamp, and the irradiation was performed with parallel rays. In the irradiation, the amount of the irradiation light was set to 40 mJ/cm$^2$. Next, the colored layer on which a latent image was formed was developed at 26° C. for 45 seconds using an aqueous solution (having a developer concentration of 2.4% by mass) that had been prepared using sodium carbonate and sodium hydrogen carbonate. Then, the colored layer was rinsed with running water for 20 seconds, and then spray-dried, as a result of which a pattern image was obtained. The obtained pattern image was subjected to post-baking treatment at 230° C. for 20 minutes, whereby a colored pattern B having a film thickness of 2 μm was obtained.

Evaluation

The colored layer A and the colored pattern B obtained above were evaluated with respect to sensitivity, specific resistance of the liquid crystal, spectral characteristics, contrast, and adhesion according to the following methods. The results of the evaluation are shown in Table 2 below.

(1) Sensitivity

The colored layer A after coating and drying obtained as described above was irradiated with light having a wavelength of 365 nm through a mask having a line width of 20 μm in a light irradiation amount of 40 mJ/cm$^2$, using an i-line reduced-projection exposure apparatus. After the irradiation, the colored layer was developed at 26° C. for 45 seconds using a developer solution (an aqueous solution prepared using sodium carbonate and sodium hydrogen carbonate (developer concentration: 2.4% by mass)). Then, colored layer was rinsed with running water for 20 seconds, and then spray-dried, whereby a fine line pattern was obtained. The image of the obtained fine line pattern was taken at a magnification of 200 times using an optical microscope. The line width was measured from the obtained fine line pattern.

Since the line width increases as the sensitivity increases, the degree of thickening of the line width as compared to the mask width was assumed to be the line width sensitivity. A larger number indicates higher sensitivity, and thus is preferable.

Here, the degree of thickening of the line width as compared to the mask width means a difference between the mask width (20 μm in the present example) and the line width of the above-described fine line pattern, and can be obtained by subtracting the mask width from the line width of the fine line pattern.

(2) Specific Resistance of Liquid Crystal

The colored pattern B obtained as described above was scraped off the substrate, and 9.0 mg of the scraped matter was added to 2.00 g of a liquid crystal material ZLI-4792 (trade name, produced by Merck) and heated at 120° C. for 5 hours. Thereafter, filtration was carried out, and the specific resistance of the liquid crystal material was measured using a liquid crystal specific resistance measurement apparatus (model number: ADVANTEST R8340ULTRA HIGH RESISTANCE ME, produced by Advantest Corporation). Since elution of metal ions decreases the specific resistance of the liquid crystal material, the elution of metal ions can be evaluated based on the degree of the specific resistance.

Evaluation Criteria

A: The specific resistance was equal to or higher than $1.0 \times 10^{11}$ MΩ, and burning failure was not observed when assembled into a liquid crystal display device to form a panel.

C: Specific resistance was lower than $1.0 \times 10^{11}$ MΩ, and a burning failure occurred when assembled into a liquid crystal display device to form a panel.

(3) Spectral Characteristics

The colored pattern B obtained as described above was observed with the naked eye, and the vividness of the color was evaluated based on the following evaluation criteria.

Evaluation Criteria

A: The hue was highly vivid.

B: The hue was vivid.

C: The hue was inferior with respect to color saturation.

(4) Contrast

The substrate on which the colored pattern B was formed was sandwiched between two polarization films, and the value of the brightness in a case in which the polarization axes of the two polarization films were set to be parallel to each other and the value of the brightness in a case in which the polarization axes of the two polarization films were set to be orthogonal to each other were measured using a color brightness meter (produced by Topcon Corporation, model number BM-5A). Based on the measured values, the brightness obtained in the case in which the polarization axes of the two polarization films were parallel to each other was divided by the brightness obtained in the case in which the polarization axes of the two polarization films were orthogonal to each other, and the resultant value was considered as contrast. A higher contrast indicates a more favorable performance as a color filter for a liquid crystal display device.

(5) Adhesion

The colored layer A obtained as described above was irradiated with light having a wavelength of 365 nm using the i-line reduced-projection exposure apparatus in an light exposure amount of 40 mJ/cm² through a mask having a mask width of 5 μm, 10 μm, 15 μm, 20 μm, or 25 μm. After the irradiation, the colored layer was developed at 23° C. for 60 seconds using the developing solution described above. Then, the colored layer was rinsed with running water for 20 seconds, and then spray-dried, whereby a fine line pattern was obtained. The formation of the fine line pattern was observed according to a usual method based on observation under an optical microscope and SEM photographic observation. The pattern size of the thinnest fine line pattern that remained on the substrate was used as index for evaluating the adhesion. Those on which thinner fine lines remained indicate that the adhesion thereof is superior.

Examples 2 to 6

A colored photosensitive composition was prepared, a colored layer and a colored pattern were formed, and evaluation was performed, in the same manner as in Example 1 except that dye A-6 and multifunctional thiol compound 1 used in Example 1 were replaced by those shown in the following Table 1. The results of the evaluation are shown in Table 2 below.

Example 7

A colored photosensitive composition was prepared, a colored layer and a colored pattern were formed, and evaluation was performed, in the same manner as in Example 1 except that the photopolymerization initiator used in Example 1 was replaced by the oxime-based photopolymerization initiator (oxime compound 2) having the following structure. The results of the evaluation are shown in Table 2 below.

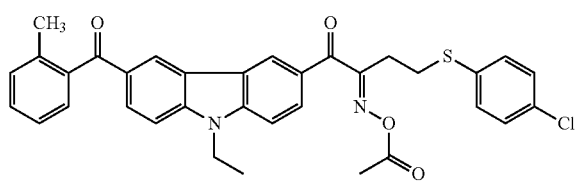 [SMILES: CCn1c2ccc(C(=O)/C(CCSc3ccc(Cl)cc3)=N/OC(C)=O)cc2c2cc(C(=O)c3ccccc3C)ccc21]

Example 8

A colored photosensitive composition was prepared, a colored layer and a colored pattern were formed, and evaluation was performed, in the same manner as in Example 1 except that the photopolymerization initiator used in Example 1 was replaced by the oxime-based photopolymerization initiator (oxime compound 3) having the following structure. The results of the evaluation are shown in Table 2 below.

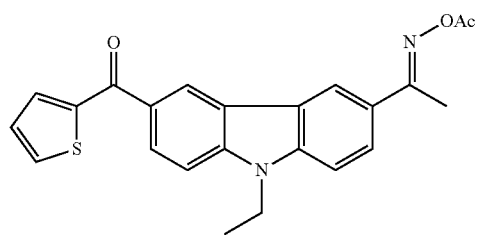 [SMILES: CCn1c2ccc(C(=O)c3cccs3)cc2c2cc(/C(C)=N/OC(C)=O)ccc21]

Example 9

A colored photosensitive composition was prepared, a colored layer and a colored pattern were formed, and evaluation was performed, in the same manner as in Example 1 except that dye A-6 used in Example 1 was replaced by dye A-12, and that the photopolymerization initiator used in Example 1 was replaced by the oxime-based photopolymerization initiator (oxime compound 4) having the following structure. The results of the evaluation are shown in Table 2 below.

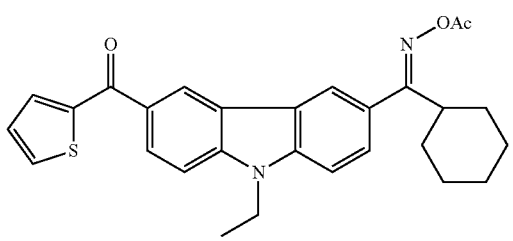 [SMILES: CCn1c2ccc(C(=O)c3cccs3)cc2c2cc(/C(=N/OC(C)=O)C3CCCCC3)ccc21]

Comparative Example 1

A colored photosensitive composition was prepared, a colored layer and a colored pattern were formed, and evaluation was performed, in the same manner as in Example 1 except that the multifunctional thiol compound 1 used in Example 1 was replaced by mercapto benzimidazole (monofunctional thiol compound 1). The results of the evaluation are shown in Table 2 below.

Comparative Example 2

A colored photosensitive composition was prepared, a colored layer and a colored pattern were formed, and evaluation was performed, in the same manner as in Example 1 except that the photopolymerization initiator used in Example 1 was replaced by 4,4'-bis(diethylamino)benzophenone (photopolymerization initiator A). The results of the evaluation are shown in Table 2 below.

Comparative Example 3

A colored photosensitive composition was prepared, a colored layer and a colored pattern were formed, and evaluation was performed, in the same manner as in Example 1 except that dye A-6 used in Example 1 was replaced by methylene blue (3,7-bis(dimethylamino)phenothiazinium chloride). The results of the evaluation are shown in Table 2 below.

TABLE 1

| | Dye | Thiol compound | Photopolymerization initiator |
|---|---|---|---|
| Example 1 | A-6 | Multifunctional thiol compound 1 | Oxime compound 1 |
| Example 2 | A-1 | Multifunctional thiol compound 2 | Oxime compound 1 |
| Example 3 | A-12 | Multifunctional thiol compound 3 | Oxime compound 1 |
| Example 4 | A-13 | Multifunctional thiol compound 4 | Oxime compound 1 |
| Example 5 | A-14 | Multifunctional thiol compound 5 | Oxime compound 1 |
| Example 6 | A-15 | Multifunctional thiol compound 6 | Oxime compound 1 |
| Example 7 | A-6 | Multifunctional thiol compound 1 | Oxime compound 2 |
| Example 8 | A-6 | Multifunctional thiol compound 1 | Oxime compound 3 |
| Example 9 | A-12 | Multifunctional thiol compound 1 | Oxime compound 4 |
| Comparative Example 1 | A-6 | Monofunctional thiol compound 1 | Oxime compound 1 |
| Comparative Example 2 | A-6 | Multifunctional thiol compound 1 | Photopolymerization initiator A |
| Comparative Example 3 | Methylene blue | Multifunctional thiol compound 1 | Oxime compound 1 |

TABLE 2

| | Sensitivity: degree of thickening of line width (μm) | Spectral Characteristics | Contrast | Adhesion (μm) | Specific resistance of liquid crystal |
|---|---|---|---|---|---|
| Example 1 | 8 | A | 22,000 | 10 | A |
| Example 2 | 7.8 | A | 21,000 | 10 | A |
| Example 3 | 7.6 | A | 22,000 | 10 | A |
| Example 4 | 7.2 | A | 22,000 | 10 | A |
| Example 5 | 7.8 | A | 21,000 | 10 | A |
| Example 6 | 7.6 | A | 20,000 | 10 | A |
| Example 7 | 6.9 | A | 22,000 | 10 | A |
| Example 8 | 7.5 | A | 20,000 | 10 | A |
| Example 9 | 7.4 | A | 20,000 | 10 | A |
| Comparative Example 1 | 2.2 | C | 16,000 | 15 | C |
| Comparative Example 2 | 2.6 | C | 18,000 | 20 | C |
| Comparative Example 3 | 7.2 | B | 18,000 | 15 | C |

As shown in Table 2, in the examples according to the invention, a color filter having excellent image contrast and excellent adhesiveness to a substrate was obtained with high sensitivity. In addition, elution of metal ions was suppressed, and the specific resistance of the liquid crystal was favorably maintained.

In contrast, in the comparative examples, the sensitivity was poor, and the spectral characteristics of the formed color filters were inferior. In addition, elution of metal ions was not suppressed, as a result of which the specific resistance of the liquid crystal was significantly decreased.

In a case in which the colored photosensitive composition according to the invention is used in the formation of a colored pattern, the pattern has excellent hue and excellent contrast, elution of metal ions is suppressed, and the adhesiveness to a substrate is excellent. Therefore, the colored photosensitive composition according to the invention is highly suitable for the formation of a colored pattern such as a color filter used in a liquid crystal display device. The colored photosensitive composition according to the invention can also be favorably used in the production of, for example, printing ink, ink jet ink, and paint.

According to the invention, a colored photosensitive composition with which a colored pattern (for example, a color filter) having high contrast, suppressed elution of metal ions, and excellent adhesiveness to a substrate can be obtained with high sensitivity is provided. According to the invention, a color filter having high contrast and being capable of favorably maintaining the specific resistance of the liquid crystal when used in a liquid crystal display device and a method of producing the color filter are also provided. According to the invention, a liquid crystal display device having high contrast and excellent electrical properties and exhibiting excellent image quality at the time of image display is also provided.

All publications, patent applications, and technical standards mentioned in this specification are herein incorporated by reference to the same extent as if each individual publication, patent application, or technical standard was specifically and individually indicated to be incorporated by reference.

The invention claimed is:

1. A colored photosensitive composition comprising:

(A) a dye represented by the following Formula (1);

(B) a multifunctional thiol compound;

(C) a photopolymerization initiator represented by the following Formula (2); and (D) a polymerizable compound:

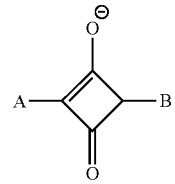

Formula (1)

wherein, in Formula (1), each of A and B independently represents an organic group comprising an aromatic ring or an organic group comprising a heterocyclic ring:

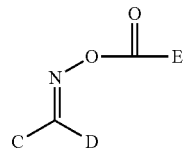

Formula (2)

wherein, in Formula (2), each of C, D, and E independently represents a hydrogen atom or an organic group.

2. The colored photosensitive composition according to claim 1, wherein the (C) photopolymerization initiator comprises an oxime compound represented by the following Formula (3):

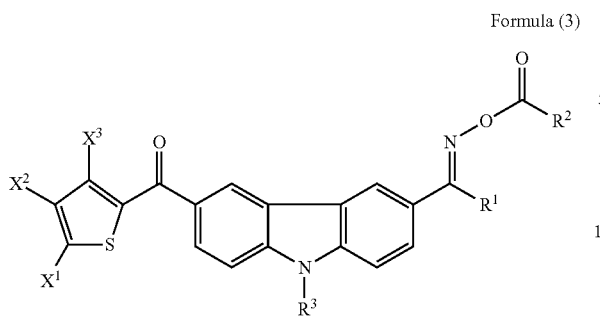

Formula (3)

wherein, in Formula (3), each of $X^1$, $X^2$, and $X^3$ independently represents a hydrogen atom, a halogen atom, or an alkyl group; $R^1$ represents —R, —OR, —COR, —SR, —CONRR', or —CN; each of $R^2$ and $R^3$ independently represents —R, —OR, —COR, —SR, or —NRR; and each of R and R' independently represents an alkyl group, an aryl group, an aralkyl group, or a heterocyclic group.

3. The colored photosensitive composition according to claim 1, wherein the (C) photopolymerization initiator includes an oxime compound represented by the following Formula (4):

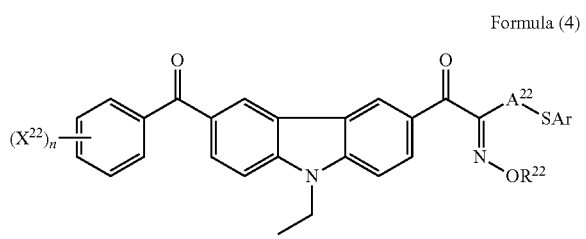

Formula (4)

wherein, in Formula (4), $R^{22}$ represents a monovalent substituent; $A^{22}$ represents a divalent linking group; Ar represents an aryl group; n represents an integer from 0 to 5; $X^{22}$ represents a monovalent substituent; and in a case in which n is an integer from 2 to 5, plural $X^{22}$s are present, and the plural $X^{22}$s may be the same as each other or different from each other.

4. The colored photosensitive composition according to claim 1, wherein the (B) multifunctional thiol compound is a compound that has two or more groups represented by the following Formula (5):

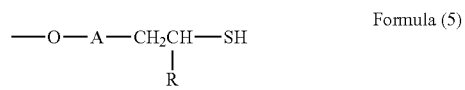

Formula (5)

wherein, in Formula (5), R represents a hydrogen atom or an alkyl group; and A represents —CO— or —CH$_2$—.

5. The colored photosensitive composition according to claim 1, wherein the (B) multifunctional thiol compound is a compound represented by the following Formula (6):

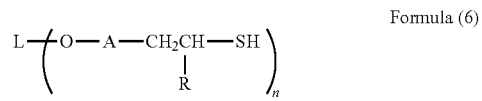

Formula (6)

wherein, in Formula (6), R represents a hydrogen atom or an alkyl group; A represents —CO— or —CH$_2$—; L represents an n-valent linking group; and n represents an integer from 2 to 6.

6. The colored photosensitive composition according to claim 1, wherein a content of the (B) multifunctional thiol compound is from 0.1% by mass to 20% by mass with respect to a total solid content of the colored photosensitive composition.

7. The colored photosensitive composition according to claim 1, wherein a content of the (A) dye is from 0.1% by mass to 50% by mass with respect to a total solid content of the colored photosensitive composition.

8. The colored photosensitive composition according to claim 1, further comprising an (E) yellow coloring agent.

9. A color filter comprising a colored layer formed using the colored photosensitive composition according to claim 1.

10. A liquid crystal display device comprising the color filter according to claim 9.

11. A method of producing a color filter, comprising:
forming a colored layer by applying the colored photosensitive composition according to claim 1 to a support;
forming a latent image by patternwise exposing the colored layer to light; and
forming a pattern by developing the colored layer on which the latent image has been formed.

12. A liquid crystal display device comprising a color filter produced using the method of producing a color filter according to claim 11.

* * * * *